(12) United States Patent
Tsukada et al.

(10) Patent No.: US 8,278,753 B2
(45) Date of Patent: Oct. 2, 2012

(54) SEMICONDUCTOR DEVICE AND PRODUCTION METHOD THEREOF

(75) Inventors: Kiyotaka Tsukada, Gifu (JP); Tetsuya Muraki, Gifu (JP); Atsunari Yamashita, Gifu (JP); Yoshitomo Tomida, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 122 days.

(21) Appl. No.: 12/952,720

(22) Filed: Nov. 23, 2010

(65) Prior Publication Data

US 2011/0121448 A1 May 26, 2011

(30) Foreign Application Priority Data

Nov. 24, 2009 (JP) .................................. 2009-266872

(51) Int. Cl.
*H01L 23/48* (2006.01)
(52) U.S. Cl. ................ 257/735; 257/785; 257/E23.011; 257/E21.506; 438/125
(58) Field of Classification Search .................. 257/735, 257/785, E23.011, E21.506; 438/125
See application file for complete search history.

(56) References Cited

U.S. PATENT DOCUMENTS

| 2006/0192253 A1* | 8/2006 | Okumura et al. ............. 257/378 |
| 2009/0120677 A1* | 5/2009 | Nomura et al. ............... 174/262 |
| 2010/0027228 A1* | 2/2010 | Tsukada et al. ............... 361/772 |
| 2011/0080714 A1* | 4/2011 | Tsukada et al. ............... 361/774 |

FOREIGN PATENT DOCUMENTS

| JP | 2006-237429 | 9/2006 |
| JP | 2009-64908 | 3/2009 |

OTHER PUBLICATIONS

U.S. Appl. No. 12/952,655, filed Nov. 23, 2010, Tsukada, et al.

* cited by examiner

*Primary Examiner* — Trung Q Dang
(74) *Attorney, Agent, or Firm* — Oblon, Spivak, McClelland, Maier & Neustadt, L.L.P.

(57) ABSTRACT

The semiconductor device comprises a support plate; a semiconductor element; and conductor posts consisting of a conductor having a first end at one end and a second end at the other end, the second end being connected to the semiconductor element and the conductor posts being connected to the support plate at a position on the side of the second end that is closer to the first end, wherein the conductor posts have a heat conductivity of approximately 200 W/m·K or higher and a Vickers hardness of approximately 70 or lower.

11 Claims, 24 Drawing Sheets

FIG.28

| SAMPLE | SUPPORT PLATE | | |
|---|---|---|---|
| | MATERIAL | SUBSTRATE THICKNESS (mm) | CONDUCTOR THICKNESS (mm) |
| #11 | HL830NS (MITSUBISHI GAS CHEMICAL) | 0.2 | 0.145 |
| #12 | HL830NS (MITSUBISHI GAS CHEMICAL) | 0.2 | 0.145 |
| #21 | — | — | — |
| #13 | POLYIMIDE (UBE INDUSTRIES) | 0.075 | 0.17 |
| #14 | POLYIMIDE (UBE INDUSTRIES) | 0.075 | 0.17 |
| #15 | POLYIMIDE (UBE INDUSTRIES) | 0.075 | 0.17 |
| #16 | POLYIMIDE (UBE INDUSTRIES) | 0.075 | 0.17 |
| #17 | POLYIMIDE (UBE INDUSTRIES) | 0.075 | 0.17 |
| #18 | POLYIMIDE (UBE INDUSTRIES) | 0.075 | 0.17 |
| #22 | POLYIMIDE (UBE INDUSTRIES) | 0.075 | 0.17 |
| #23 | POLYIMIDE (UBE INDUSTRIES) | 0.075 | 0.17 |

FIG.29

| SAMPLE | CONDUCTOR POST | | | | |
|---|---|---|---|---|---|
| | MATERIAL | HEAT CONDUCTIVITY (W/m·°C) | AVERAGE DIAMETER (mm) | ASPECT RATIO (—) | FITTING AREA (mm²) |
| #11 | C1020 (MITSUBISHI SHINDOH) | 397 | 0.44 | 1.35 | 0.276 |
| #12 | IN99 (SUMITOMO LIGHT METAL) | 238 | 0.36 | 2.78 | 0.144 |
| #21 | 1060 (TANAKA HOLDINGS) | 238 | 0.4 | 38 | — |
| #13 | C1020 (MITSUBISHI SHINDOH) | 397 | 0.36 | 2.78 | 0.144 |
| #14 | C2100 (MITSUBISHI SHINDOH) | 234 | 0.36 | 2.78 | 0.144 |
| #15 | C1020 (MITSUBISHI SHINDOH) | 397 | 0.36 | 1.35 | 0.144 |
| #16 | C1020 (MITSUBISHI SHINDOH) | 397 | 0.36 | 3.63 | 0.144 |
| #17 | C1020 (MITSUBISHI SHINDOH) | 397 | 0.36 | 8.52 | 0.144 |
| #18 | C1020 (MITSUBISHI SHINDOH) | 397 | 0.36 | 0.8 | 0.144 |
| #22 | KOVAR WIRE (SUMITOMO ELECTRIC INDUSTRIES) | 19.7 | 0.36 | 2.78 | 0.144 |
| #23 | TAMAC5 (MITSUBISHI SHINDOH) | 188 | 0.36 | 2.78 | 0.144 |

FIG.30

| SAMPLE | CONNECT POSTS TO SUPPORT PLATE | | | MOUNT CHIP ON CONNECTION BOARD | | |
|---|---|---|---|---|---|---|
| | HIGHEST TEMPERATURE (°C) | 240°C AND ABOVE (min) | COOLING RATE (°C/min) | HIGHEST TEMPERATURE (°C) | 270°C AND ABOVE (min) | COOLING RATE (°C/min) |
| #11 | 280 | 35 | −5 | 350 | 25 | −100 |
| #12 | 280 | 35 | −5 | 350 | 25 | −100 |
| #21 | — | — | — | 180 | <1 | — |
| #13 | 350 | 35 | −10 | 350 | 25 | −100 |
| #14 | 350 | 35 | −10 | 350 | 25 | −100 |
| #15 | 350 | 35 | −10 | 350 | 25 | −100 |
| #16 | 350 | 35 | −10 | 350 | 25 | −100 |
| #17 | 350 | 35 | −10 | 350 | 25 | −100 |
| #18 | 350 | 35 | −10 | 350 | 25 | −100 |
| #22 | 350 | 35 | −10 | 350 | 25 | −100 |
| #23 | 350 | 35 | −10 | 350 | 25 | −100 |

FIG.31

| SAMPLE | VICKERS HARDNESS | | | |
|---|---|---|---|---|
| | AFTER POSTS INSERTED | AFTER POSTS JOINED | AFTER CHIP JOINED | AFTER CYCLE TEST |
| #11 | 115 | 63 | 42 | 68 |
| #12 | 93 | 25 | 24 | 72 |
| #21 | — | — | 75 | 78 |
| #13 | 112 | 42 | 43 | 52 |
| #14 | 105 | 55 | 49 | 64 |
| #15 | 111 | 41 | 46 | 71 |
| #16 | 111 | 41 | 46 | 48 |
| #17 | 110 | 39 | 42 | 44 |
| #18 | 113 | 39 | 43 | 101 |
| #22 | 160 | 158 | 155 | 155 |
| #23 | 135 | 92 | 90 | 93 |

FIG.32

| SAMPLE | POWER CYCLE TEST | | |
|---|---|---|---|
| | CURRENT FOR REACHING 150°C (A) | NUMBER OF CYCLES | DISCONNECTION SITE |
| #11 | 60 | >430000 | — |
| #12 | 23 | 285546 | SOLDER FILLET SIDEWALL |
| #21 | 13 | 1225 | WIRE CONNECTION PART |
| #13 | 55 | >430000 | — |
| #14 | 32 | 312867 | SOLDER FILLET SIDEWALL |
| #15 | 60 | >430000 | — |
| #16 | 54 | >430000 | — |
| #17 | 29 | >430000 | — |
| #18 | 61 | 12379 | SOLDER FILLET SIDEWALL TO INSIDE OF POST SOLDER |
| #22 | 12 | 1870 | SOLDER FILLET SIDEWALL |
| #23 | 16 | 3018 | SOLDER FILLET SIDEWALL |

SEMICONDUCTOR DEVICE AND PRODUCTION METHOD THEREOF

CROSS-REFERENCE TO RELATED APPLICATION

This application claims the benefit of Japanese Patent Application No. 2009-266872, filed on Nov. 24, 2009, the entire disclosure of which is incorporated by reference herein.

FIELD

This application relates generally to a semiconductor device and production method thereof.

BACKGROUND

Semiconductor devices on which electronic parts such as semiconductor elements are mounted are required to endure heat cycles due to repeated operations, maintain electric connections and insulations, and stably support parts. Particularly, it is important for high-power semiconductor devices including semiconductor modules containing power semiconductor elements such as IGBTs (insulated gate bipolar transistors) to have high heat discharge properties and endure repeated heat cycles. If cracks occur in the solder at the junction of the power semiconductor element as a result of repeated heat cycles, the thermal resistance or electric resistance is increased and, in worse cases, the damage is accelerated by heat generation and the device fails to function.

Unexamined Japanese Patent Application KOKAI Publication No. 2006-237429 discloses a semiconductor device having electrode members and semiconductor elements mounted using the electrode members. The electrode members are composed of an insulating support plate (feeding plate) having multiple through-holes and multiple conductor posts (feeding posts) provided in the through-holes. The conductor posts are connected to the electrodes of the semiconductor elements. According to the technique of the Unexamined Japanese Patent Application KOKAI Publication No. 2006-237429, a semiconductor element is joined using the above-described electrode member comprising multiple conductor posts for one electrode. Then, thermal stress applied to the interface between the metal posts and semiconductor element is reduced compared with one conductor post being used for one electrode. Hence, the connection reliability of a semiconductor element is increased even if the metal posts and semiconductor element have significantly different thermal expansion abilities.

Unexamined Japanese Patent Application KOKAI Publication No. 2009-64908 discloses a semiconductor device having a support plate (feeding plate) consisting of, for example, a glass epoxy resin substrate and columnar conductors (conductor posts). The technique of the Unexamined Japanese Patent Application KOKAI Publication No. 2009-64908 improves electric conduction reliability and heat cycle endurance relating to heat conductivity.

The entire disclosure of Unexamined Japanese Patent Application KOKAI Publication No. 2006-237429 and Unexamined Japanese Patent Application KOKAI Publication No. 2009-64908 is incorporated herein.

SUMMARY

The semiconductor device according to a first exemplary aspect of the present invention comprises a support plate; a semiconductor element; and conductor posts consisting of a conductor having a first end at one end and a second end at the other end, the second end being connected to the semiconductor element and the conductor posts being connected to the support plate at a position on the side of the second end that is closer to the first end, wherein the conductor posts have a heat conductivity of approximately 200 W/m·K or higher and a Vickers hardness of approximately 70 or lower.

The semiconductor device production method according to a second exemplary aspect of the present invention is a semiconductor device production method including: connecting conductor posts to a support plate; and connecting the conductor posts to a semiconductor element, wherein the conductor posts have a Vickers hardness of approximately 100 or higher at least either when the conductor posts are connected to the support plate or when the conductor posts are connected to the semiconductor element and, then, the Vickers hardness of the conductor posts is adjusted to approximately 70 or lower.

BRIEF DESCRIPTION OF THE DRAWINGS

A more complete understanding of this application can be obtained when the following detailed description is considered in conjunction with the following drawings, in which:

FIG. 28 is a table showing the support plate material and so on in Embodiments 1 to 8 and Comparative Embodiments 1 to 3;

FIG. 29 is a table showing the conductor post material and so on in Embodiments 1 to 8 and Comparative Embodiments 1 to 3;

FIG. 30 is a table showing the soldering conditions in Embodiments 1 to 8 and Comparative Embodiments 1 to 3;

FIG. 31 is a table showing the measurements of Vickers hardness in Embodiments 1 to 8 and Comparative Embodiments 1 to 3; and FIG. 32 is a table showing the power cycle endurance test results in Embodiments 1 to 8 and Comparative Embodiments 1 to 3.

DETAILED DESCRIPTION

Figure 1:
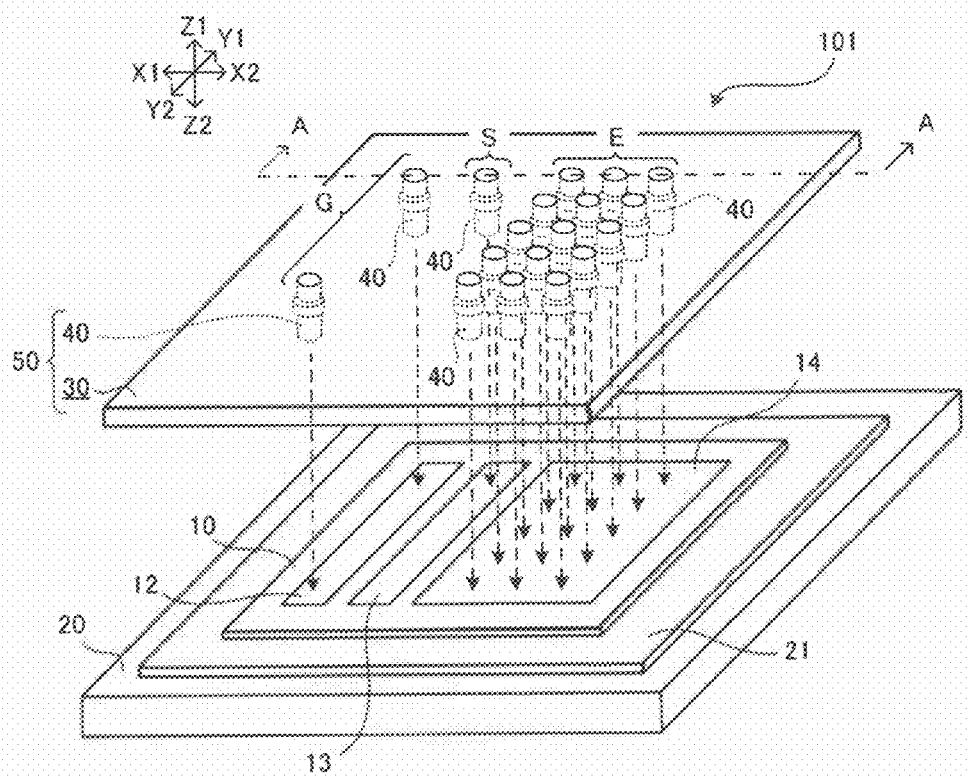
FIG. 1 is an illustration showing the semiconductor device according to an embodiment of the present invention.

IGBT modules generally have multiple IGBT elements per module. For example, a three-phase alternating-current IGBT module has six IGBT elements and an FWD (free wheeling diode) element. Therefore, one module tends to have a larger area. Furthermore, in a high-power IGBT module, one element also tends to have a larger area.

In an IGBT module in which the elements have a large area, heat strain within an element tends to be increased, and heat strain within a module also tends to be increased when the support plate, IGBT elements, and heat discharging plate used for mounting the IGBT elements on the surface, discharging heat, and providing insulation have significantly different thermal expansion coefficients. Particularly, when a resin support plate is used, the support plate and heat discharging plate tend to have significantly different thermal expansion coefficients since the heat discharging plate is generally formed by a ceramic or insulated metal having a lower thermal expansion coefficient than the resin. The difference in thermal expansion tends to cause heat strain and undulation or warpage tends to occur in the vertical direction of the support plate. Consequently, the conductor posts tend to receive shear stress or tensile stress and experience buckling.

A heat discharging plate made of a material having a thermal expansion coefficient as low as the heat discharging place, such as a ceramic, can be used as the support plate of an IGBT module. However, ceramics are generally highly rigid. When a ceramic heat discharging plate is used, large strain tends to occur in the junctions of conductor posts and IGBT elements or their electrodes if any temperature difference occurs in spite of a small difference in thermal expansion.

The semiconductor devices described in the Unexamined Japanese Patent Application KOKAI Publication No. 2006-237429 and Unexamined Japanese Patent Application KOKAI Publication No. 2009-64908 are presumably useful for alleviating heat strain in a small region and in a combination of low thermal expansion coefficients. However, in a large element or module such as a large module in which many elements are arranged, any difference in thermal expansion coefficient tends to cause strain to accumulate in a larger region; it is difficult to obtain sufficient reliability.

Recently, power elements allowing a large amount of current to run in spite of their small size have been developed and the heat generation tends to be accordingly increased. In regard to the materials themselves for IGBT elements, SiC (silicon carbide)-based elements have been developed in addition to traditional Si (silicon)-based elements. Some new elements have a highest reaching temperature of approximately 250° C. to approximately 350° C. while the traditional highest reaching temperature is approximately 150° C. to approximately 180° C. Therefore, the heat strain occurring in an IGBT module tends to be increased and there is a demand for reliability against heat strain.

The present invention can provide a semiconductor device highly reliable against long-term heat cycles even if the support plate and heat discharging plate have significantly different thermal expansion coefficients and easily subject to strain or warpage at the ends and a production method thereof.

An embodiment of the present invention will be described hereafter. In the figures, the arrows Z1 and Z2 each indicate the wiring board lamination direction corresponding to the direction of a normal line to the main surfaces (front and back sides) of the wiring board (namely the thickness direction of the heat discharging plate). On the other hand, the arrows X1, X2 and Y1, Y2 indicate the directions perpendicular to the lamination direction (the directions parallel to the main surfaces of the wiring board). The main surfaces of the wiring board are in an X-Y plane. The sides of the wiring board are in an X-Z plane or in a Y-Z plane.

In the embodiment, two main surfaces facing in opposite directions in the normal line direction are referred to as a first surface (the surface facing in the direction of the arrow Z1) and a second surface (the surface facing in the direction of the arrow Z2). In other words, the main surface on the opposite side to the first surface is the second surface and the main surface on the opposite side to the second surface is the first surface.

The conductor post is parallel to the insert direction and has an axis passing through the gravity center of each cross section of the conductor post (the center in the case of a circle). In this embodiment, the Z direction, which is the insert direction, is the axial direction. A cross section perpendicular to the axial direction (an X-Y plane) is referred to as a horizontal cross section. A cross section parallel to the axial direction (an X-Z plane or Y-Z plane) is referred to as a vertical cross section.

Additionally, a layer containing a conductor pattern serving as wires for circuits is referred to as a wiring layer. A conductor formed in a through-hole is referred to as a through-hole conductor. A wiring layer may contain lands of through-hole conductors in addition to a conductor pattern. The term "hole" includes through-holes and non-through holes. With regard to non-through holes, the "wall" of a hole includes the sidewall and bottom. The "width" of a hole or column (protrusion) refers to the diameter in the case of a circle and $\sqrt{(4\times \text{cross-sectional area}/\pi)}$ in other shapes unless otherwise specified (which will be described in detail later). When a conductor is formed on the wall of a hole, the width of the hole is reduced by the thickness of the conductor unless otherwise defined. When a hole or column (protrusion) is tapered, the "width" of two or more holes or protrusions is found to be consistent or inconsistent by comparing the values, average value, or largest value at corresponding points (which will be described in detail later). The term "insert" means that a member sufficiently thin for the diameter of a hole is inserted in the hole or a member is fitted or screwed in a hole.

Figure 2:
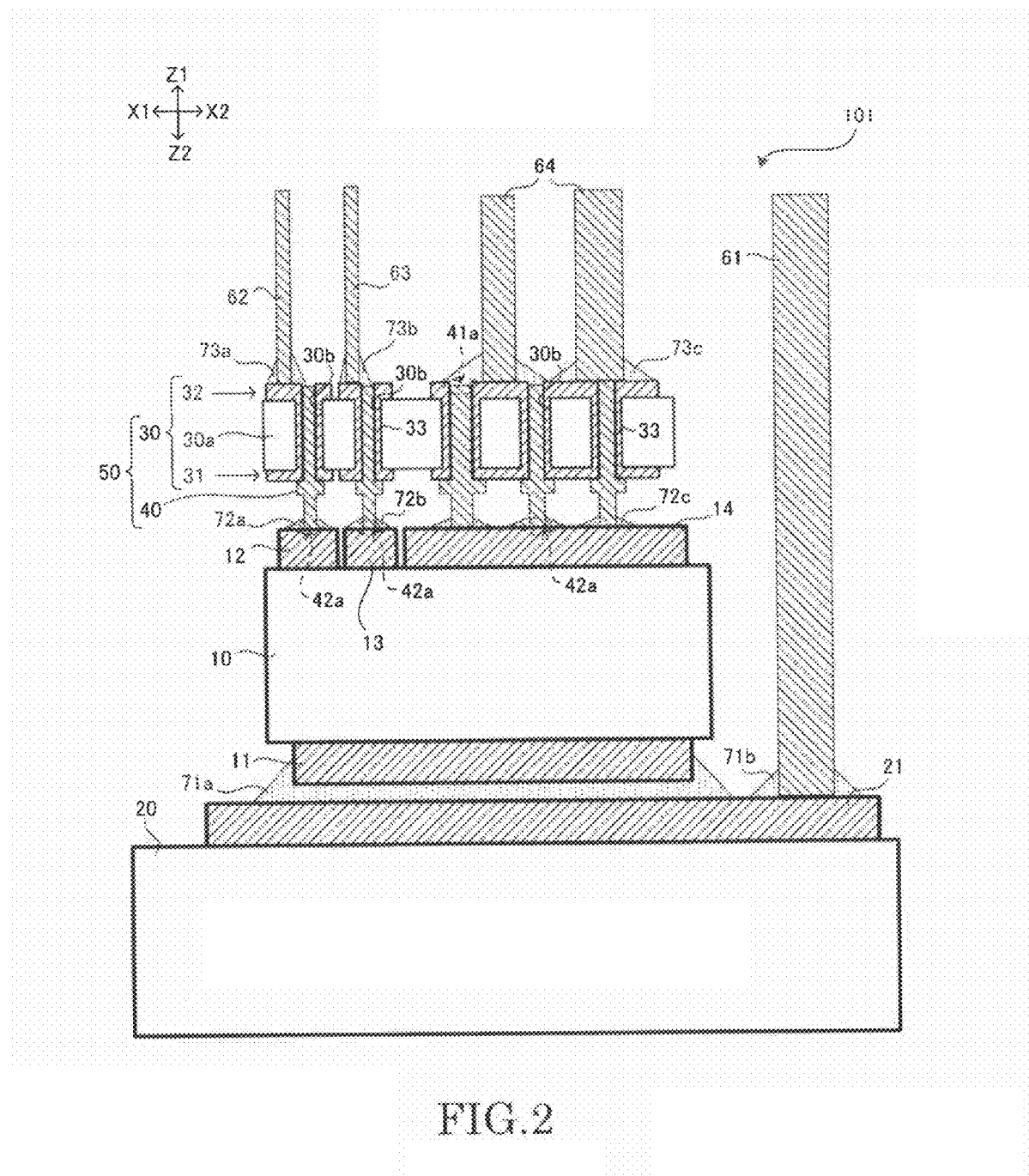
FIG. 2 is a cross-sectional view at the line A-A in FIG. 1.

FIGS. 1 and 2 show a semiconductor device 101 of this embodiment. FIG. 1 is an exploded view of the semiconductor device 101. Some elements are omitted in FIG. 1 for convenience of explanation. FIG. 2 is a cross-sectional view at the line A-A in FIG. 1.

The semiconductor device 101 comprises a semiconductor element 10, a heat discharging plate 20, a connection board 50, and external connection terminals 61 to 64. The connection board 50 comprises a support plate 30 and conductor posts 40 (conductor posts).

The semiconductor element 10 consists of, for example, an IGBT element. However, the semiconductor element 10 is not restricted thereto and can be another power semiconductor element such as a GTO (gate turn-off thyristor) used in switching power sources and inverters. Furthermore, the semiconductor element 10 is not restricted to a power semiconductor element and can be any kind of element.

The heat discharging plate 20 is made of, for example, an insulating ceramic plate, heat-resistant resin, or insulated metal plate. However, the heat discharging plate 20 is not restricted thereto and can be made of any material.

An electrode 11 is formed on the second surface (back side) of the semiconductor element 10. The electrode 11 is, for example, a collector electrode. On the other hand, electrodes 12, 13, and 14 are formed on the first surface (front side) of the semiconductor element 10. The electrode 12 is, for example, a gate electrode. The electrode 13 is, for example, an electrode for various censors. The electrode 14 is, for example, an emitter electrode.

A conductive electrode 21 (a conductor layer) is formed on the first surface of the heat discharging plate 20 (the main surface on the support plate side). The electrode 21 of the heat discharging plate 20 is electrically connected to the electrode 11 of the semiconductor element 10 via a conductive material 71a. Then, the semiconductor element 10 is fixed to the heat discharging plate 20. The conductive material 71a is, for example, a brazing filler metal such as solder and silver solder, conductive paste, or the like. The conductive material 71a has properties varying (for example, hardening) according to, for example, temperature or pressure. Such change in properties can facilitate bonding of the electrodes 11 and 21. The part connected by the conductive material 71a is referred to as the first connection part hereafter.

The support plate 30 is a wiring board composed of an insulating substrate 30a, conductor circuits 31 and 32, and conductors 33 (through-hole conductors). The conductor circuit 31 is formed on the second surface (underside) of the insulating substrate 30a. The conductor circuit 32 is formed on the first surface (top surface) of the insulating substrate 30a. Multiple (as many as the conductor posts 40) holes 30b are formed in the support plate 30. The holes 30b are, for example, through-holes. The conductors 33 are formed on the walls of the holes 30b. Here, the holes 30b can be bottomed holes (see FIG. 10 described later). The conductor circuits 31 and 32 and conductors 33 are made of, for example, copper. Copper is extensively used as a printed wiring board and easily available. However, the material is not restricted to copper and can be any conductive material.

The conductor posts 40 are columnar conductors made of a metal such as copper (which will be described in detail later). The conductor posts 40 are categorized into, for example, gate posts G connected to the electrode 12 (a gate electrode), sensor posts S connected to the electrode 13 (a sensor electrode), and emitter posts E connected to the electrode 14 (an emitter electrode). For example, two conductor posts 40 belong to the gate post G. For example, one conductor post 40 belongs to the sensor post S. For example, 15 (3×5) conductor posts 40 belong to the emitter post E.

Figure 3:
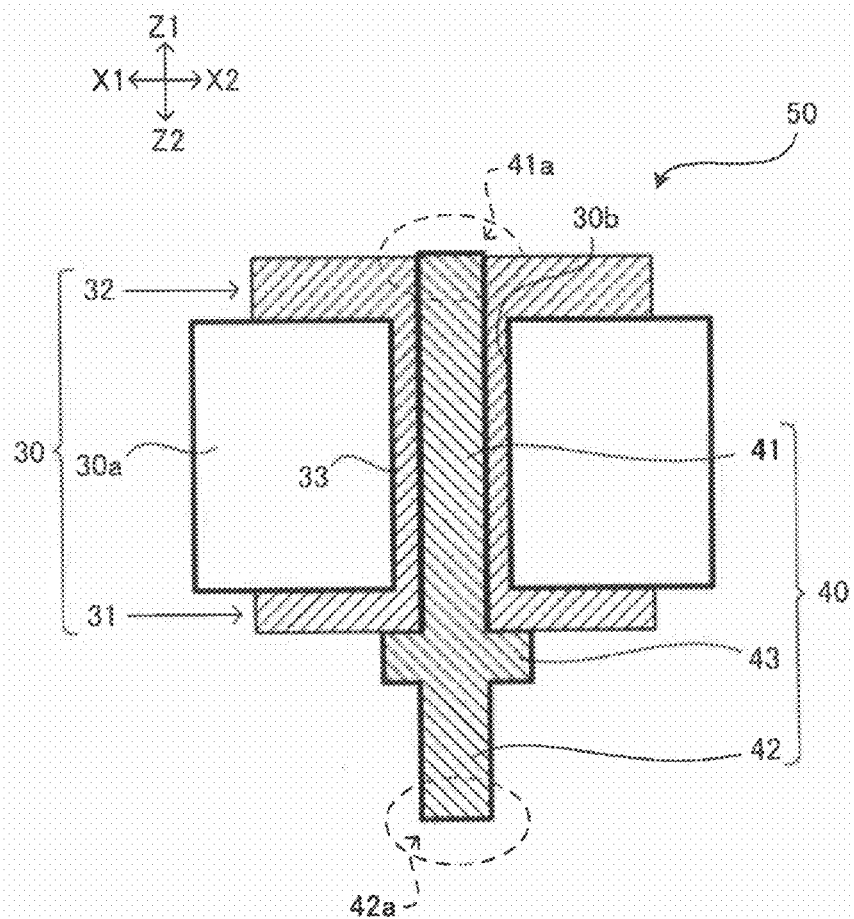
FIG. 3 is a cross-sectional view showing the connection structure between a conductor post and the support plate according to an embodiment of the present invention.
Figure 4:
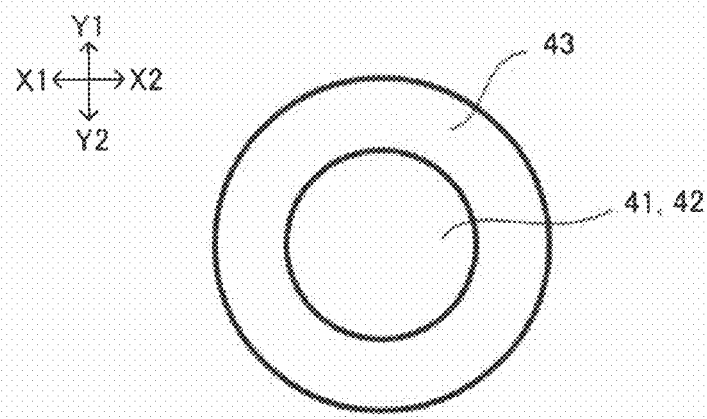
FIG. 4 is a plane view showing the structure of a conductor post according to an embodiment of the present invention.

The conductor posts 40 belonging to the gate post G, sensor post S, and emitter post E each have a first column part 41, a second column part 42, and a flange 43 as shown in FIG. 3 (cross-sectional view) and FIG. 4 (plane view). The flange 43 serves as a stopper. In other words, when the conductor posts 40 are inserted in the holes 30b, the flange 43 prevents excessive insertion.

The conductor posts 40 have a first end 41a at one end and a second end 42a at the other end. The first end 41a is the end of the first column part 41 that faces in the direction of the arrow Z1. The second end 42a is the end of the second column part 42 that faces in the direction of the arrow Z2 (the opposite end to the first end 41a). The first column part 41, second column part 42, and flange 43 are each nearly columnar. However, they are not confined thereto and can have any shape (see FIGS. 13A to 19 described later).

The conductor posts 40 are inserted in the holes 30b in part (the first column part 41) from the first end 41a. The second ends 42a of the conductor posts 40 each are connected to the electrode 12, 13, or 14. The conductor posts 40 are fixed with its part inserted in the holes 30b.

The electrodes 12, 13, and 14 and the second ends 42a of the conductor posts 40 are electrically connected via conductive materials 72a, 72b, and 72c, respectively. The conductive materials 72a to 72c are, for example, a brazing filler metal such as solder and silver solder, conductive paste, or the like. The conductive materials 72a to 72c have adhesive properties like the conductive material 71a. The parts connected by the conductive materials 72a to 72c are referred to as the second connection part hereafter.

The external connection terminal 61 is connected to the electrode 21. The external connection terminals 62 to 64 are connected to the conductor circuit 32. The external connection terminal 61 and electrode 21 are electrically connected via a conductive material 71b. The external connection terminals 62, 63, and 64 and conductor circuit 32 are electrically connected via conductive materials 73a, 73b, and 73c, respectively. As a result, the external connection terminal 62 and electrode 12, the external connection terminal 63 and electrode 13, and the external connection terminal 64 and electrode 14 are electrically connected to each other in pairs. The conductive materials 71b and 73a to 73c are, for example, a brazing filler metal such as solder and silver solder, conductive paste, or the like. The conductive materials 71b and 73a to 73c have adhesive properties like the conductive material 71a.

In the semiconductor device 101 having the above structure, the material of the conductor posts 40 preferably has a high heat conductivity. More specifically, the material preferably has a heat conductively of approximately 200 W/m·K or higher. In this embodiment, the conductor posts 40 are made of a material having a heat conductively of approximately 200 W/m·K or higher (specific materials will be given later). As a result, the durability against thermal stress is improved. This matter will be described in detail hereafter.

When the semiconductor device 101 is in use, the semiconductor element 10 generates heat as soon as a current runs and the semiconductor element 10 is subject to dimensional change due to thermal expansion. The heat transfers to the support plate 30 mainly via the conductor posts 40.

The material of the conductor posts 40 can be, for example, an iron-based alloy and more specifically kovar $FeNi_{29}Co_{12}Sn_{0.2}$ having a heat conductivity of approximately 19.7 W/m·K (simply "koval" hereafter). Koval has a low heat conductivity and often used, for example, as a pin material. However, such a material leads to the conductor posts 40 having a low heat conductivity and the heat does not readily transfer to the support plate 30. Then, the support plate 30 tends to undergo only slight temperature rise while the semiconductor element 10 undergoes rapid temperature rise; difference in temperature between them easily occurs. When a significant difference in temperature between them occurs, the difference in thermal expansion is increased compared with when they have the same temperature and large thermal stress easily occurs in the second connection part (the conductive materials 72a to 72c). If such thermal stress occurs intermittently over a prolonged period, cracks may occur in the second connection part, which may finally lead to disconnection.

On the other hand, when the conductor posts 40 are made of a material having a heat conductivity of approximately 200 W/m·K or higher, the heat can easily transfer to the support plate 30 and the above thermal stress is easily alleviated. Consequently, the durability against thermal stress is improved.

Furthermore, the material of the conductor posts 40 preferably has a low degree of hardness. More specifically, the material preferably has a Vickers hardness of approximately 70 or lower and more preferably has a Vickers hardness of approximately 65 or lower. In this embodiment, the conductor posts 40 are made of a material having a Vickers hardness of approximately 65 or lower (specific materials will be given later). As a result, the durability against thermal stress is improved. Here, the hardness is the hardness before the semiconductor device 101 is activated. This matter will be described in detail hereafter.

The semiconductor element 10 rapidly generates heat at the same time as a current runs through the semiconductor element 10 to activate the semiconductor device 101. The conductor posts 40 transfer heat to the support plate 30 by heat conduction. It takes a while until the temperature of the support plate 30 is elevated to a sufficient temperature. Therefore, when a current is rapidly increased, for example, upon start of the semiconductor device 101, a large difference in temperature between the semiconductor element 10 and support plate 30 occurs before the support plate 30 is sufficiently warmed up. Then, the connection parts (such as the second connection part) are required to have durability to endure thermal stress due to such difference in temperature.

In this regard, the conductor posts 40 of this embodiment are made of a material having a Vickers hardness of approximately 65 or lower. With the conductor posts 40 having a low degree of hardness, in other words, being soft in this way, large thermal stress is temporarily absorbed by the conductor posts 40 and the stress on the entire connection parts can be alleviated. Consequently, the durability against thermal stress is improved. Such an effect is apparent with a material having a Vickers hardness of approximately 70 or lower and more apparent with a material having a Vickers hardness of approximately 65 or lower.

The Young's modulus is also an index (physical value) for hardness (or softness). The Vickers hardness, not the Young's modulus, is used as an index for hardness in this embodiment. This is because it is difficult to measure a Young's modulus after assembled in a device. The Vickers hardness can be measured using a minimal part and without affecting the reliability of a device.

From the viewpoint of satisfying the above conditions (heat conductivity and hardness), it is effective to use, for example, a metal or alloy consisting primarily of copper, aluminum, silver, or gold as the material of the conductor posts 40. Among them, a metal or alloy consisting primarily of copper or aluminum is particularly effective. Such a material is easy to control the hardness and inexpensive.

From the viewpoint of feasibility, it is preferable to use a commercially available material for producing the conductor posts 40. Examples of commercially available copper include high-purity copper and copper consisting of high-purity copper mixed with a trace amount of adjuncts (impurity elements) such as Zn, Sn, and Ag. For example, Zr-based oxygen-free copper mixed with a trace amount of Zn and Sn and Sn-based oxygen-free copper are used for pins and lead frames. On the other hand, high-purity copper tends to be softened and, for this reason, is not used for pins and lead frames. Zr-based oxygen-free copper and Sn-based oxygen-free copper have a high softening temperature. Therefore, high-purity copper is more preferable than these materials for satisfying the above condition (hardness) of this embodiment.

High-purity copper containing only a small amount of impurity elements has a recrystallization temperature of approximately 250° C. or lower. Then, the metal posts can be softened at temperatures in a reflow furnace. Then, the substrate (particularly a resin substrate) is subject to little damage.

Examples of effective high-purity copper include oxygen-free copper and tough pitch copper. These coppers have a low recrystallization temperature and, therefore, a lower heat treatment temperature can be used. Then, the conductor posts 40 can be softened without giving damage such as change of properties and warpage to the substrate (particularly a resin substrate). As a result, the conductor posts 40 can easily have a Vickers hardness of approximately 60 or lower after the heat treatment.

Tough pitch copper has a copper purity of approximately 99.90% or higher. The remaining part consists primarily of oxygen in the form of copper oxide. Therefore, it has a low content of impurity elements.

Oxygen-free copper is particularly preferable because it is not embrittled even if heated in a reducing atmosphere. Examples of preferably usable oxygen-free copper include C1011 and C 1020 defined by JIS H0500. These oxygen-free coppers have a very high copper purity, approximately 99.99% and approximately 99.96% respectively, and a low content of impurity elements.

Oxygen-free copper C1020 or C1100 containing approximately 99.96% or more of copper constituents can be used as the material of the conductor posts 40. Other materials that can be used as the material of the conductor posts 40 include phosphorous-deoxidized copper C1220 containing "approximately 99.90% or more of copper and approximately 0.03% of phosphorus"; C1070 containing "approximately 99.9% of copper and approximately 0.1% of Ag"; a material containing "approximately 99.84% of copper, approximately 0.15% of Sn, and approximately 0.006% of phosphorus"; and red brass C2100 containing "approximately 99.5% of Cu and approximately 0.5% of Zn."

When an aluminum-based material is used as the material of the conductor posts 40, pure aluminum series 1N99, 1N90, 1050, 1060, 1070, 1080, and the like are effective. Other materials that can be used as the material of the conductor posts 40 include 6N01 containing "approximately 0.65% of Si and approximately 0.6% of Mg"; 6036 containing "approximately 0.4% of Si and approximately 0.6% of Mg"; and 7072 containing "approximately 1% of Zn and approximately 0.1% of Mg."

The width of the conductor posts 40 (the definition of "width" will be given later) is preferably approximately 2 mm or smaller and particularly preferably approximately 1 mm or smaller. When the diameter is small and the material has a low level of hardness, the conductor posts 40 can easily be deformed. Furthermore, local thermal stress does not easily occur in the first and second ends 41a and 42a of the conductor posts 40 even if there is some difference in thermal expansion from the semiconductor element 10. It can be easier to prevent cracks or bubbles in the conductive materials 72a to 72c due to excessive thermal stress and, eventually, prevent junction failure. Such a phenomenon tends to be apparent when the diameter is smaller than approximately 2 mm and more apparent when the diameter is smaller than approximately 1 mm. Therefore, with the conductor posts 40 having a width of approximately 2 mm or smaller and more preferably approximately 1 mm or smaller, thermal stress does not easily occur and it is easier to improve the reliability against long-term heat cycles.

The ratio of L to D, namely L/D (the aspect ratio hereafter) in which D is the width of the conductor posts 40 and L is the length of the part up to the second end 42a of the conductor posts 40 that is not inserted in the hole 30b (the part protruding from the support plate 30 toward the heat discharging plate 20) (the definition of "length" will be given later) is preferably approximately 1.1 or higher and particularly preferably approximately 1.25 or higher. As the aspect ratio is decreased, D and L become nearly equal. Then, the conductor posts 40 are not easily deformed due to generated thermal stress. On the other hand, as the aspect ratio is increased, the conductor posts 40 are easily deformed and able to more easily absorb high thermal stress. Such an effect is apparent when the aspect ratio is 1.1 or higher and more apparent when the aspect ratio is 1.25 or higher. However, when the aspect ratio is equal to or lower than approximately 5, it takes less time for heat to reach the support plate 30 and the conductor posts 40 does not need to keep absorbing high thermal stress for a long time. Furthermore, when the aspect ratio is equal to or lower than approximately 5, the conductor posts 40 does not easily receive external mechanical stress such as vibration. For this reason, the aspect ratio is preferably approximately 1.1 to approximately 5 and more preferably approximately 1.25 to approximately 3.

The junction area between all conductor posts 40 and semiconductor element 10 is preferably approximately 2% of the area of one surface of the semiconductor element 10. When the semiconductor element 10 is rapidly heated, more conductor posts 40 can more easily absorb more thermal stress. However, it is difficult to connect many conductor posts 40 to the electrodes 12 to 14 at the same time. Therefore, preferably, the conductor posts 40 are provided more in a region of the heat-generating semiconductor element 10 where heat is generated earlier so as to efficiently absorb thermal stress. According to experiments conducted by the present inventor, presumably, sufficient durability against thermal stress can be obtained with the junction area between the conductor posts 40 and semiconductor element 10 being approximately 2%.

Figure 5:
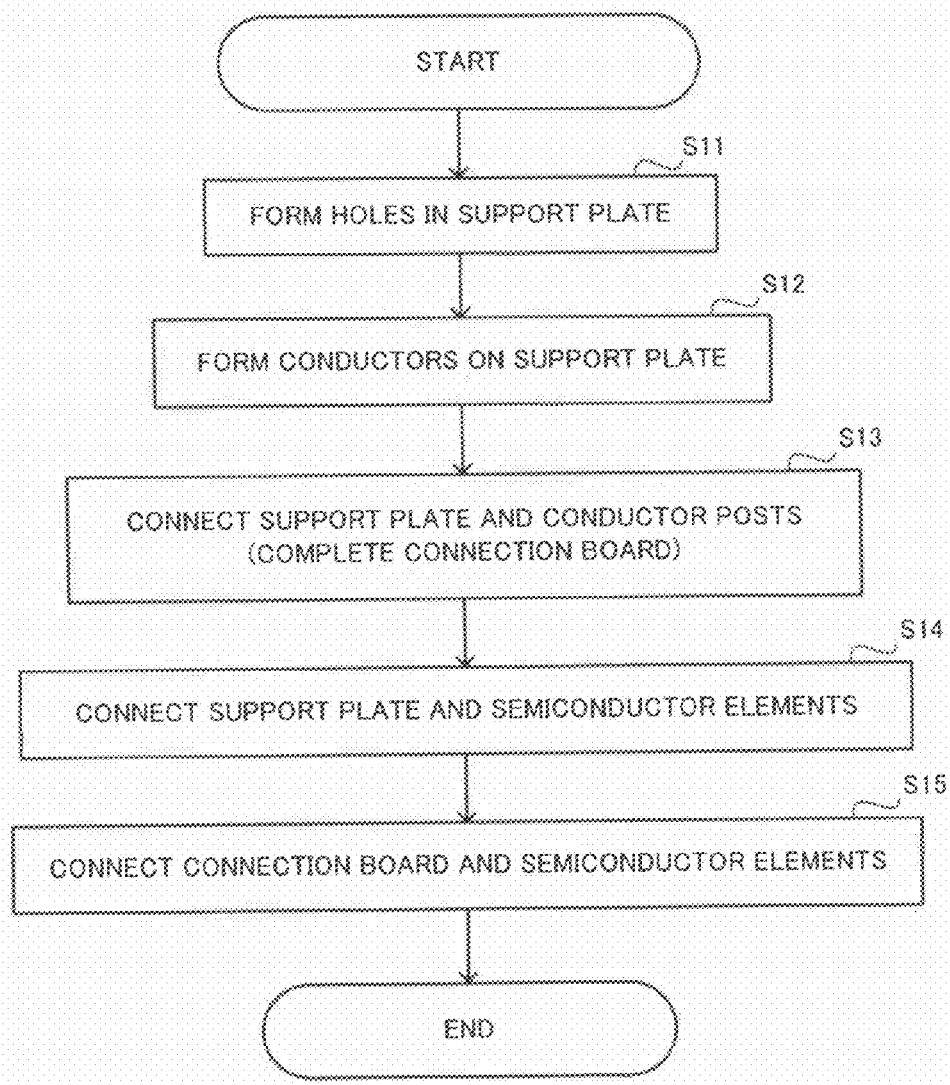
FIG. 5 is a flowchart showing the contents and process of the method of producing the semiconductor device according to an embodiment of the present invention.

The semiconductor device 101 is produced, for example, in the process as shown in FIG. 5.

In Step S11, the holes 30b are formed in the insulating substrate 30a at positions where the conductor posts 40 are to be mounted. The holes 30b can be formed, for example, by drilling or laser.

In subsequent Step S12, conductors are formed on the insulating substrate 30a. In other words, conductor layers are formed on either side of the insulating substrate 30a, for example, by plating so that conductors 33 are formed on the walls of the holes 30b. Then, the conductor layers on either side are patterned to form the conductor circuits 31 and 32. The patterning can be conducted before or after Step S13. Here, the conductor layers can be formed by any method. For example, metal foils (such as copper foils) prepared separately can be bonded to the insulating substrate 30a. Alternatively, the conductor layers and conductors 33 can be formed by electroless plating, sputtering, or vapor deposition followed by plating. However, plating is preferable to form conductors also on the walls of the holes 30b. Conductors can easily be formed also on the walls of the holes 30b by plating.

In subsequent Step S13, the conductor posts 40 are inserted in the holes 30b from the first end 41a. Then, the connection board 50 is completed. The conductor posts 40 can be fitted in or fixed after insertion. Furthermore, after the conductor posts 40 are fitted in, the fixity can be reinforced.

In subsequent Step S14, the semiconductor element 10 is mounted on (connected to) the heat discharging plate 20.

In subsequent Step S15, the semiconductor element 10 is mounted on (connected to) the connection board 50.

Then, the external connection terminals 61 to 64 are connected to complete the semiconductor device 101. Here, the details of the above Steps S11 to S15 will be described in Embodiments 1 and 2 given later. The sequence of these steps can be changed as appropriate.

In the above method of producing the semiconductor device 101, it is preferable that the conductor posts 40 have a Vickers hardness of approximately 100 or higher at the stage of production. This matter will be described hereafter.

The conductor posts 40 are softened when heated to or above the recrystallization temperature. If there is no allowance in fitting and some conductor posts are stuck, they can not be further inserted. On the other hand, when there is some allowance in fitting, it is difficult to maintain the conductor posts 40 upright with their top ends at an equal height. Therefore, if there is excessive allowance, the connection between the conductor posts 40 and semiconductor element 10 may be insufficient, causing cracks during the use. For this reason, it is preferable that the conductor posts 40 have a Vickers hardness of approximately 100 or higher at the stage of production. Such conductor posts 40 are so hard that they can be inserted deep even if there is no allowance in fitting. However, it is preferable that the Vickers hardness of the conductor posts 40 is adjusted to the above-mentioned approximately 70 or lower at least before the semiconductor device 101 is used. Hence, it is preferable that the conductor posts 40 have a Vickers hardness of approximately 100 or higher at least either (preferably both) when the conductor posts 40 are connected to the support plate 30 or when the conductor posts 40 are connected to the semiconductor element 10, and then the Vickers hardness of the conductor posts 40 is adjusted to approximately 70 or lower.

Figure 6:
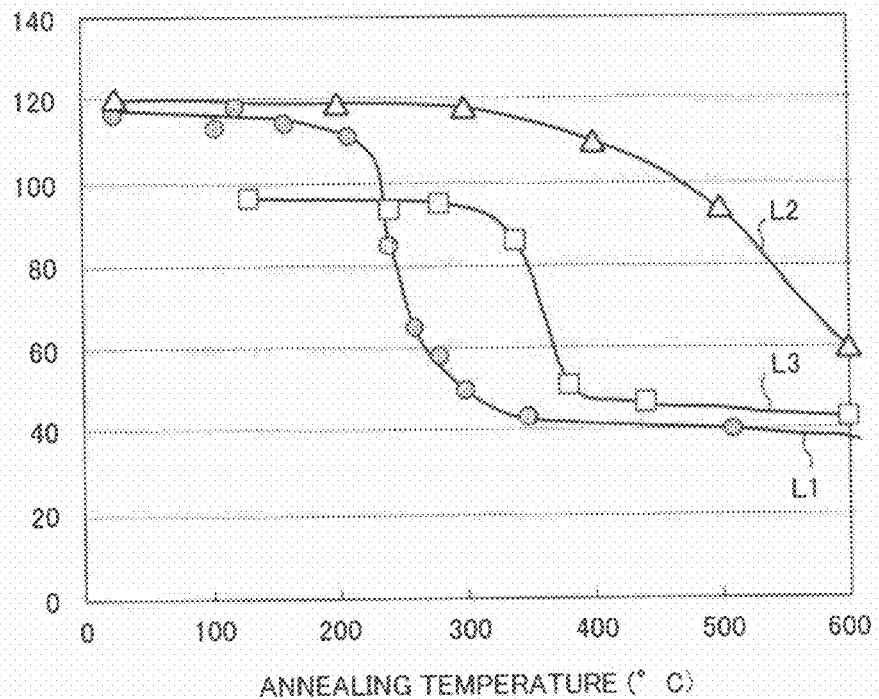
FIG. 6 is a graphical representation showing the relationship between annealing temperature and Vickers hardness.

For producing the conductor posts 40 consisting primarily of copper or aluminum, it is preferable that heat treatment including heating and slow cooling such as annealing is conducted in advance or at the stage of production. FIG. 6 shows the relationship between Vickers hardness and annealing temperature on oxygen-free copper (the line L1), Zr—OFC (the line L2), and 70/30 brass (the line L3) for reference.

The present invention is not restricted to the above embodiment and can be implemented with the following modifications.

Figure 7:
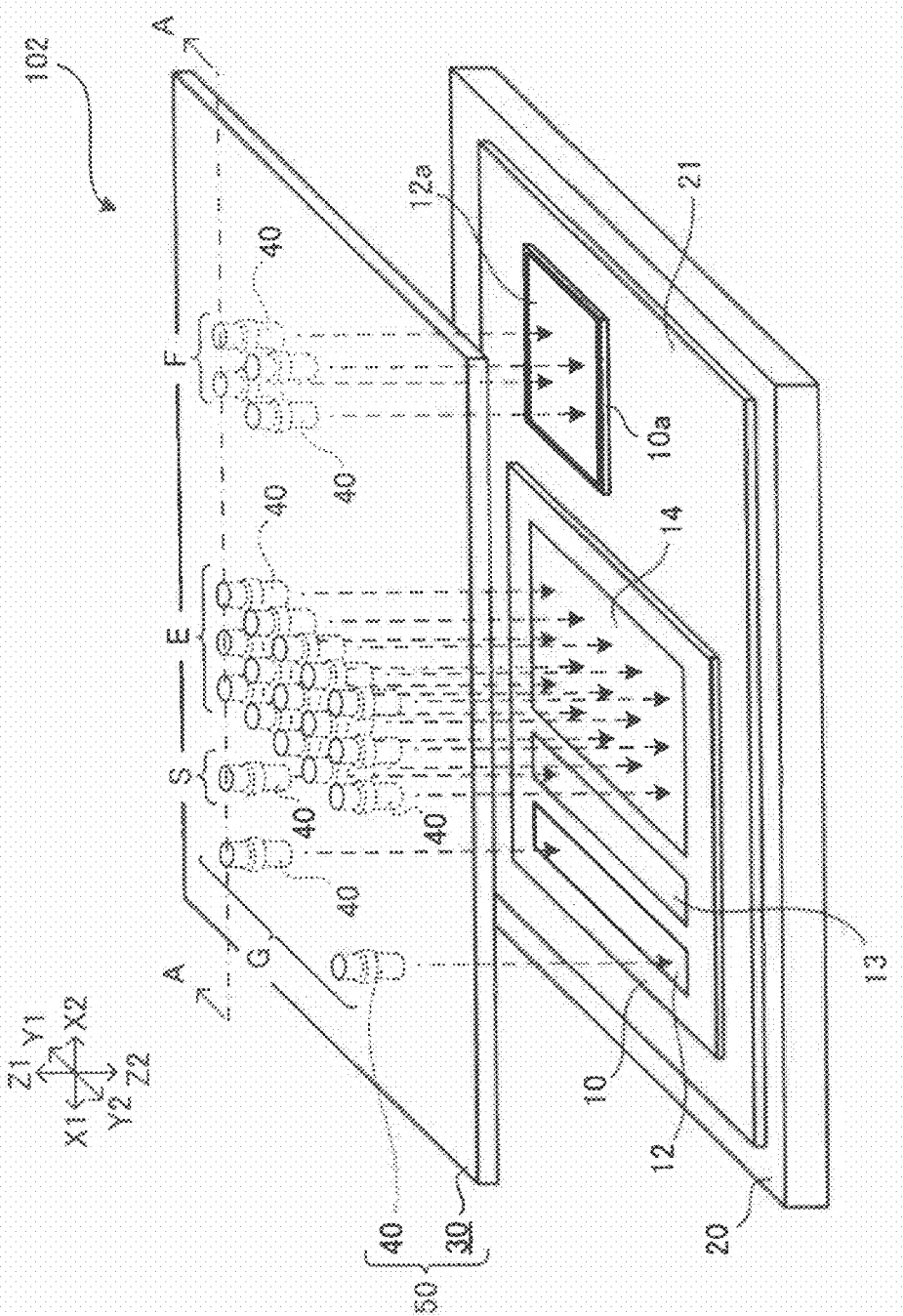
FIG. 7 is an illustration showing a semiconductor device containing an IGBT element and an FWD element according to an embodiment of the present invention.
Figure 8:
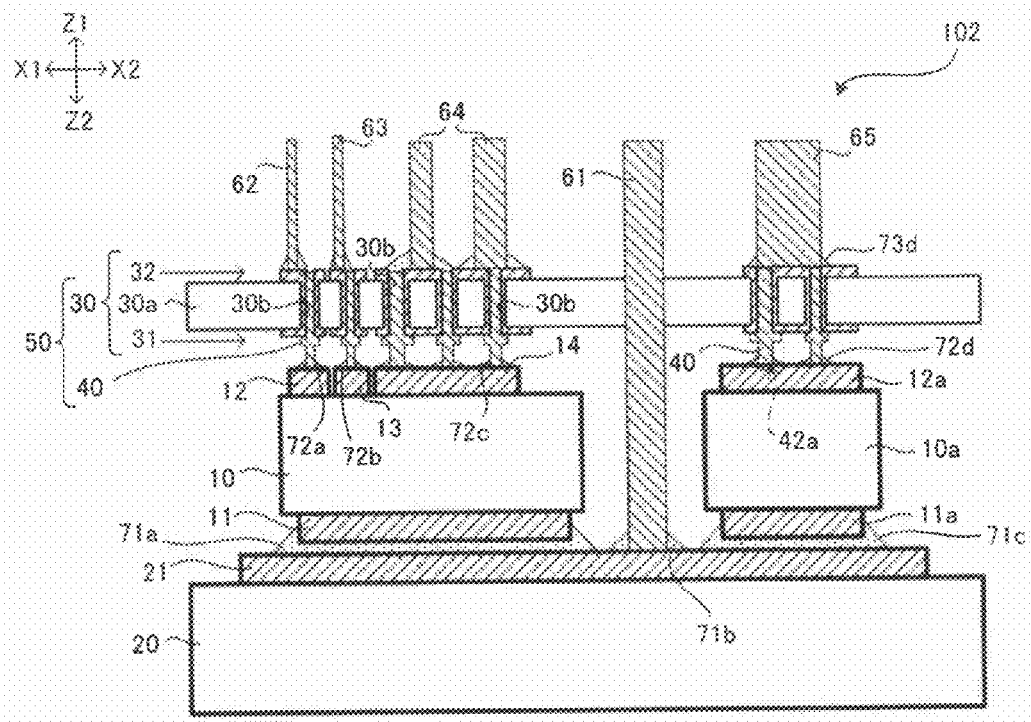
FIG. 8 is a cross-sectional view at the line A-A in FIG. 7.

Multiple semiconductor elements can be used. Furthermore, multiple semiconductor elements of multiple kinds can be used. For example, as in a semiconductor device 102 shown in FIG. 7 (corresponding to FIG. 1) and FIG. 8 (corresponding to FIG. 2), a semiconductor element 10a consisting of an FWD element can be provided in addition to the semiconductor element 10 consisting of an IGBT element. The semiconductor element 10a is mounted, for example, between the emitter and collector of the semiconductor element 10 in parallel. The semiconductor element 10a has an electrode 11a on the second surface (back side) and an electrode 12a on the first surface (front side).

In this case, the conductor posts 40 are categorized also into FWD posts F connected to the electrode 12a (an FWD electrode) in addition to gate posts G, sensor posts S, and emitter posts E. For example, four (2×2) conductor posts 40 belong to the FWD post F. Furthermore, the electrode 11a is electrically connected to the electrode 21 via a conductive material 71c. The part connected by the conductive material 71c is also included in the above-described first connection part. The electrode 12a is electrically connected to the second ends 42a of the conductor posts 40 via a conductive material 72d. The part connected by the conductive material 72d is also included in the above-described second connection part. An external connection terminal 65 is electrically connected to the conductor circuit 32 via a conductive material 73d. As a result, the external connection terminal 65 and electrode 12a are electrically connected to each other. Here, the conductive materials 71c, 72d, and 73d are, for example, a brazing filler metal such as solder and silver solder, conductive paste, or the like. The conductive materials 71c, 72d, and 73d have adhesive properties like the conductive material 71a.

With an FWD element being provided in parallel to an IGBT element as described above, it can be easier to alleviate noise (reverse current) caused by the switching of the IGBT element.

Figure 9:
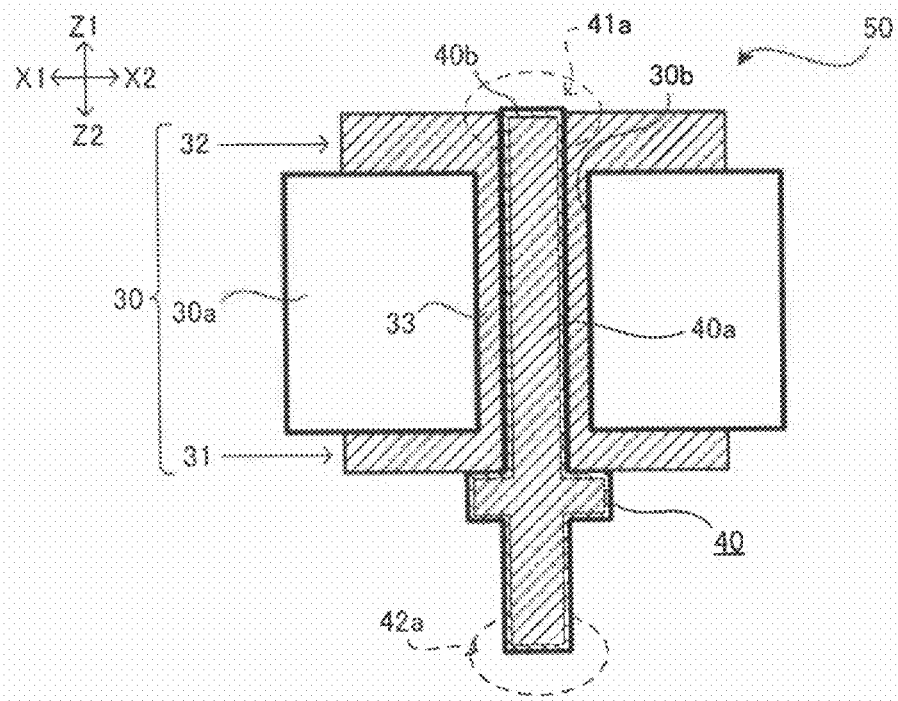
FIG. 9 is an illustration showing a coated conductor post according to an embodiment of the present invention.

The conductor posts 40 can be coated while taking into account influence on the overall hardness. As shown in FIG. 9 by way of example, a conductor post 40 can be composed of a columnar conductor 40a and a coating film 40b wherein the columnar conductor 40a is covered with the highly hard coating film 40b. A material consisting primarily of copper, silver, gold, or aluminum is an effective material for the columnar conductor 40a. Examples of effective materials for the coating film 40b include chrome, nickel, palladium, titanium, or platinum. Particularly, a thin metal film of Ni, Cr, or Ti having a thickness of approximately 10 μm is effective as the coating film 40b. The conductor posts 40 can be coated, for example, by plating to form a Ni or Cr film having a thickness of approximately 10 μm or by sputtering to form a Ti film.

Figure 10:
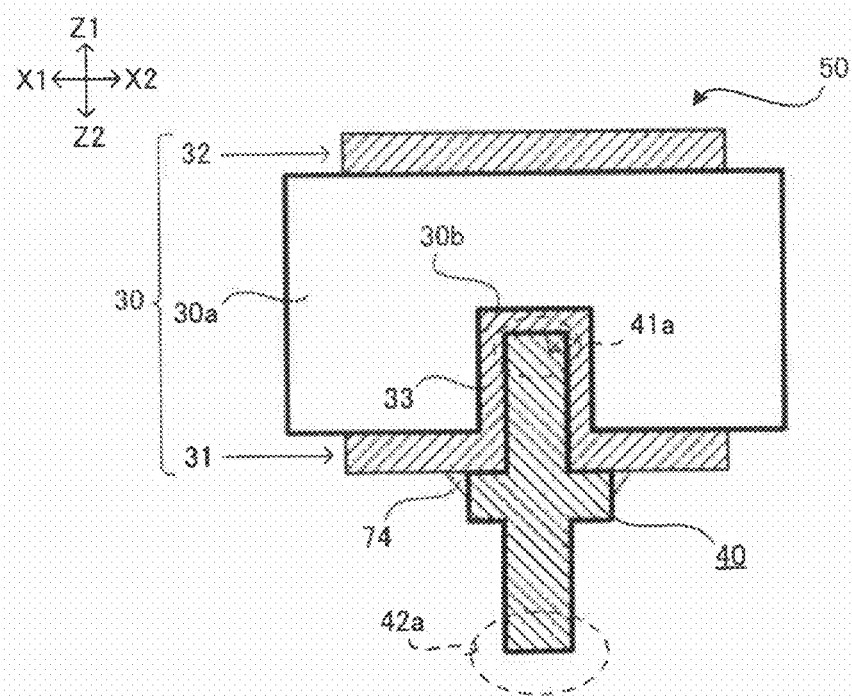
FIG. 10 is an illustration showing a conductor post inserted in a bottomed hole according to an embodiment of the present invention.

As shown in FIG. 10, the holes 30b can be bottomed holes. The conductor 33 can be formed on the entire wall of the hole 30b or only on the sidewall of the hole 30b.

Figure 20A:
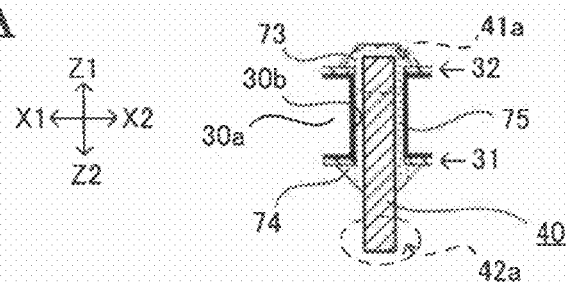
FIG. 20A is an illustration showing a semiconductor device in which a straight conductor post thinner than the hole is inserted in the entire hole according to an embodiment of the present invention.
Figure 20B:
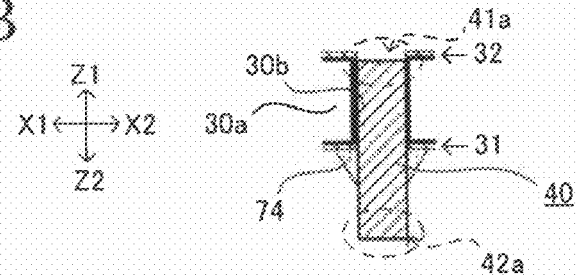
FIG. 20B is an illustration showing a semiconductor device in which a straight conductor post having nearly the same width as the hole is inserted in the entire hole according to an embodiment of the present invention.
Figure 20C:
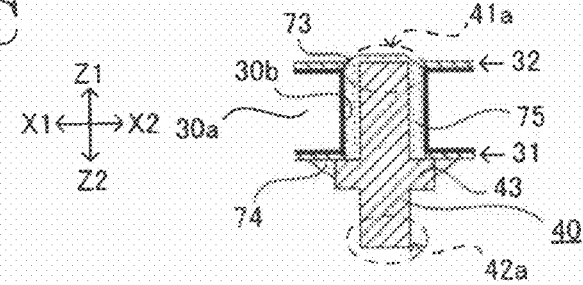
FIG. 20C is an illustration showing a semiconductor device in which a conductor post is inserted in the entire hole with the flange making area-contact with the support plate according to an embodiment of the present invention.
Figure 20D:
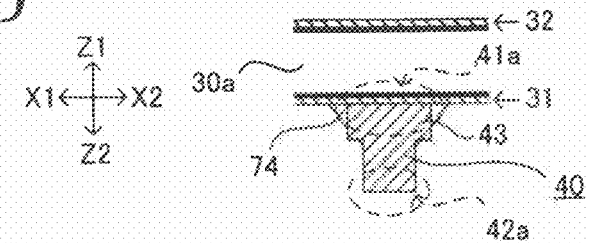
FIG. 20D is an illustration showing a semiconductor device in which a conductor post directly makes area-contact with the conductor circuit without being inserted in a hole according to an embodiment of the present invention.

Furthermore, the holes 30b may not be formed as long as the support plate 30 and conductor posts 40 are connected to each other (see FIG. 20D described later).

Figure 11:
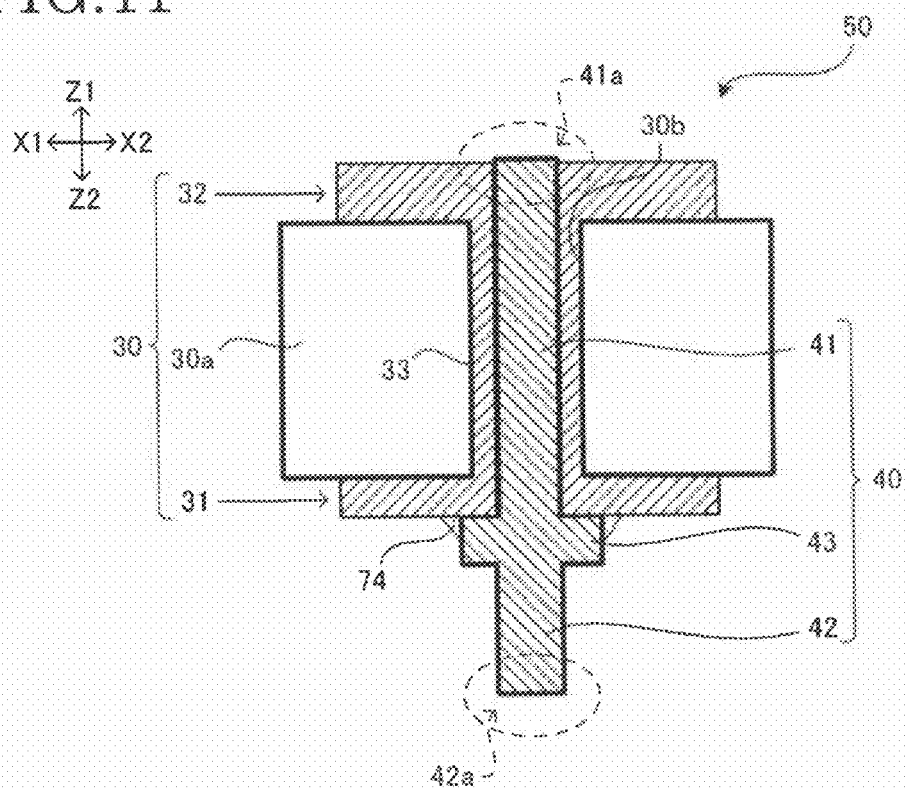
FIG. 11 is an illustration showing a conductive material provided on the second surface of the support plate for connecting a conductor post according to an embodiment of the present invention.

As shown in FIG. 11, a conductive material 74 can be provided on the second surface of the support plate 30 to increase the connection strength between the support plate 30 and conductor posts 40. Here, the conductive material 74 is, for example, a brazing filler metal such as solder and silver solder, conductive paste, or the like. The conductive material 74 has adhesive properties like the conductive material 71a.

Figure 12:
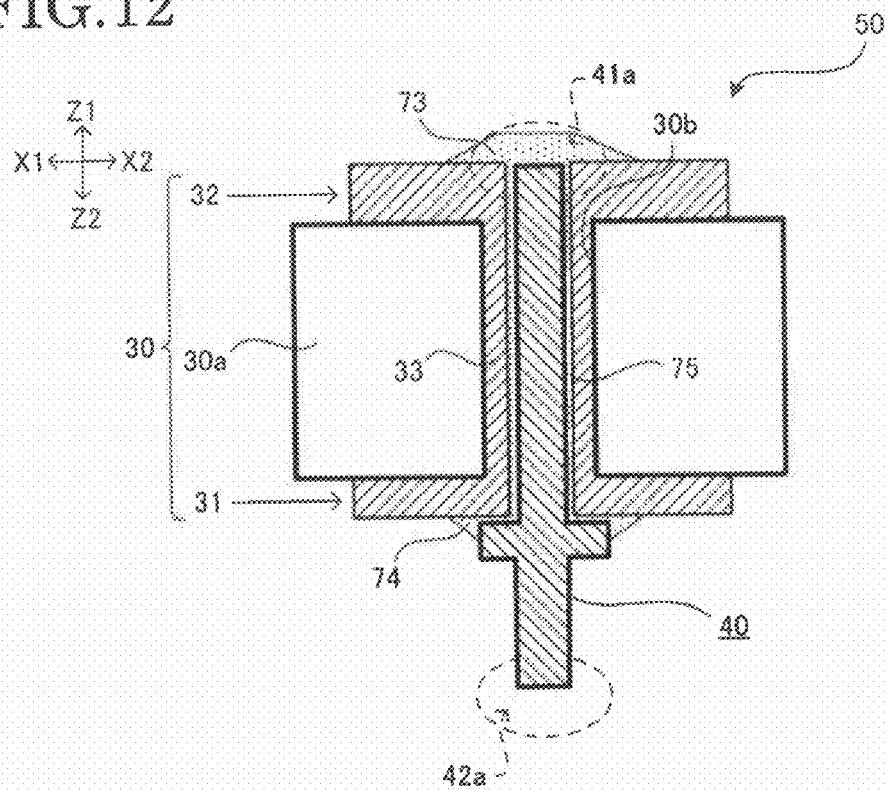
FIG. 12 is an illustration showing a conductive material filled between a conductor post and the support plate according to an embodiment of the present invention.

As shown in FIG. 12, the gap between the conductor post 40 and support plate 30 in a hole 30b can be filled with, for example, a conductive material 75. In this way, the connection strength between the conductor posts 40 and support plate 30 is improved. Here, the conductive material 75 is, for example, a brazing filler metal such as solder and silver solder, conductive paste, or the like. The conductive material 75 has adhesive properties like the conductive material 71a.

Figure 20E:
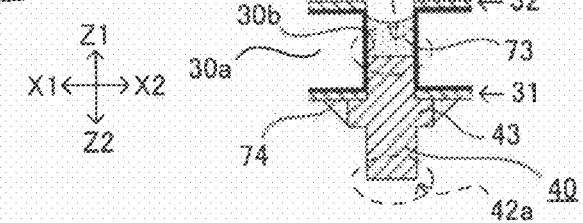
FIG. 20E is an illustration showing a semiconductor device in which a conductor post is inserted in a part of the hole with the flange making area-contact with the support plate according to an embodiment of the present invention.
Figure 20F:
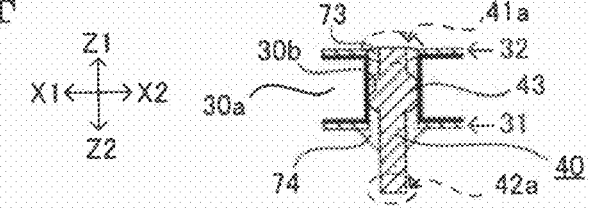
FIG. 20F is an illustration showing a semiconductor device in which the flange of a conductor post is inserted and fixed in the hole according to an embodiment of the present invention.

As shown in FIG. 12, the conductive materials 74 and 75 can be continued from a conductive material 73 on the conductor post 40 (in the direction of the arrow Z1). They can easily be formed by utilizing the conductive material 73 trickling down due to gravity. The conductive material 73 on the conductor post 40 can be provided for purposes other than making connection to the external connection terminal 62 and the like (for example, see FIGS. 20E and 20F described later).

Figure 13A:
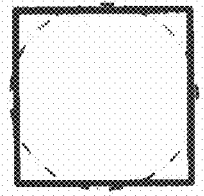
FIG. 13A is an illustration showing a regular tetragon as another conductor post shape according to an embodiment of the present invention.
Figure 13B:
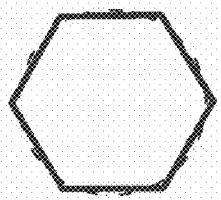
FIG. 13B is an illustration showing a regular hexagon as another conductor post shape according to an embodiment of the present invention.
Figure 13C:
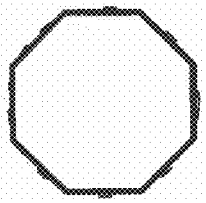
FIG. 13C is an illustration showing a regular octagon as another conductor post shape according to an embodiment of the present invention.

The shape of the conductor posts 40 is not restricted to a nearly columnar shape. For example, the end face of the conductor posts 40 (the end face of the first end 41a or second end 42a), or a horizontal cross section (an X-Y plane) of the first column part 41 (particularly the first end 41a), second column part 42 (particularly the second end 42a), or flange 43 is not restricted to a nearly circular shape (nearly perfect circle). These face and plane can be in the shape of a nearly regular polygon such as a nearly regular tetragon, nearly regular hexagon, and nearly regular octagon as shown in FIGS. 13A, 13B, and 13C. Additionally, these face and plane can be nearly U, nearly L, or nearly V-shaped. Here, the nearly polygonal or nearly U, nearly L, or nearly V shape can have any angle including nearly right, acute, and blunt angles or be rounded. However, rounded corners are preferable for preventing concentration of thermal stress.

Figure 14:
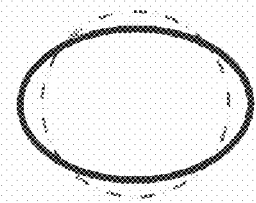
FIG. 14 is an illustration showing an oval as another conductor post shape according to an embodiment of the present invention.

Furthermore, as shown in FIG. 14, the above face and plane can be nearly oval. Furthermore, they can be nearly rectangular or nearly triangular. However, these shapes are disadvantageous because they are anisotropic.

The above-described nearly circle, nearly oval, and nearly regular polygon are advantageous because they are easy to be similar to the holes in shape.

Figure 15A:
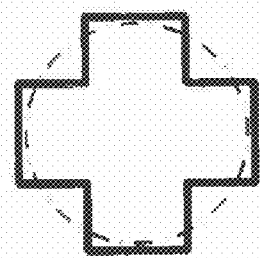
FIG. 15A is an illustration showing a cross as another conductor post shape according to an embodiment of the present invention.
Figure 15B:
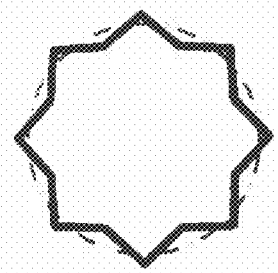
FIG. 15B is an illustration showing a regular polygonal star shape as another conductor post shape according to an embodiment of the present invention.
Figure 15C:
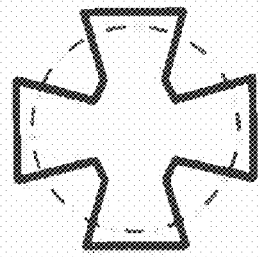
FIG. 15C is an illustration showing a cosmos shape as another conductor post shape according to an embodiment of the present invention.
Figure 16A:
FIG. 16A is an illustration showing a straight shape as another conductor post shape according to an embodiment of the present invention.
Figure 16B:
FIG. 16B is an illustration showing a tapered shape as another conductor post shape according to an embodiment of the present invention.
Figure 16C:
FIG. 16C is an illustration showing a barrel shape as another conductor post shape according to an embodiment of the present invention.
Figure 16D:
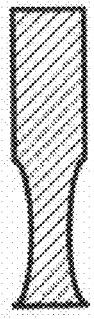
FIG. 16D is an illustration showing a drum shape as another conductor post shape according to an embodiment of the present invention.

Furthermore, as shown in FIGS. 15A to 15C, a shape consisting of lines radially extending from the center (consisting of multiple wings radially arranged) such as a nearly cross shape (for example, see FIG. 15A), nearly regular polygonal star shape (for example, see FIG. 15B), and cosmos shape (for example, see FIG. 15C) is also effective as the shape of the above face and plane. The conductor posts 40 having such a shape are suitable for being inserted in the holes 30b having a simple shape such as a nearly columnar shape.

In addition, a combination (mixture) of the above shapes can be used. Furthermore, one of these shapes can be the opening shape of the holes 30b. The end face shape of the conductor posts 40 and the opening shape of the holes 30b can be similar or non-similar. Therefore, their shapes can each be selected, for example, from the shapes shown in FIGS. 13A to 15C and used in any combination.

The area of the end face of the conductor posts 40 (particularly the end face of the second end 42a) is preferably nearly equal to the area of a circle of approximately 2 mm in diameter when the area is regarded as the area of a circle (see the dash-dot lines in FIGS. 13A to 15C).

On the other hand, a vertical cross section (an X-Z or Y-Z plane) of the conductor posts 40 is not restricted to a stepped shape (for example, see FIG. 3) and can be in any shape. The shape can be, as shown in FIGS. 16A to 16D, nearly straight (for example, see FIG. 16A), nearly tapered (for example, see FIG. 16B), nearly barrel-shaped (for example, see FIG. 16C), or drum-shaped (for example, see FIG. 16D).

Figure 17:
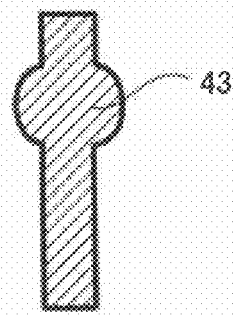
FIG. 17 is an illustration showing another flange shape according to an embodiment of the present invention.
Figure 18:
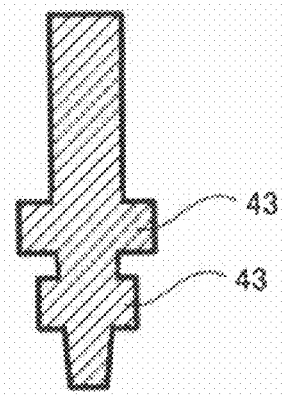
FIG. 18 is an illustration showing a conductor post having multiple flanges according to an embodiment of the present invention.

The flange 43 can also be in any shape and, for example, spherical as shown in FIG. 17. Furthermore, any number of flanges 43 can be provided. As shown in FIG. 18 by way of example, the flanges 43 (protrusions) can be provided at multiple (for example two) positions on the sidewall (peripheral surface) of the conductor posts 40.

Figure 19:
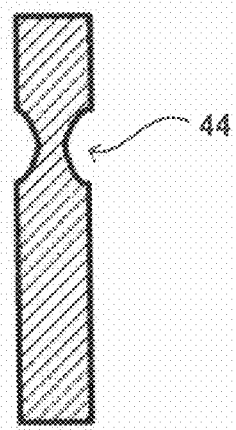
FIG. 19 is an illustration showing a conductor post having a recess according to an embodiment of the present invention.

As shown in FIG. 19 by way of example, an indentation 44 (recess) can be provided on the sidewall (peripheral surface) of the conductor posts 40. The shape and number of indentations 44 can be determined on an arbitrary basis.

The dimension of the conductor posts 40 can be changed according to the dimension of the holes 30b. FIGS. 20A to 20F show representative conductor posts 40 inserted in the holes 30b. The conductor posts shown in FIGS. 20A to 20F will be referred to as conductor posts #A to #F hereafter.

The conductor posts #A, #B, #C, and #F are conductor posts inserted in the entire hole 30b. These conductor posts #A, #B, #C, and #F pass through the hole 30b and may protrude in the direction of the arrow Z1. On the other hand, the conductor post #E is inserted in a part of the hole 30b.

The conductor posts #C, #D, and #E are area-connected to the support plate 30. Among them, the conductor post #D is directly connected to the conductor circuit 31 without being inserted in the hole 30b. The conductor posts #C and #E are each inserted in the hole 30b and area-connected to the conductor circuit 31.

The insert part of the conductor posts #A and #C has a width smaller than the width of the hole 30b. The insert part of the conductor posts #B and #E has a width equal to or larger than the width of the hole 30b. The conductor post #F has a flange 43 having a width nearly equal to the width of the hole 30b and the flange 43 is inserted in the hole 30b. The part other than the flange 43 has a width smaller than the width of the hole 30b.

Figure 21A:
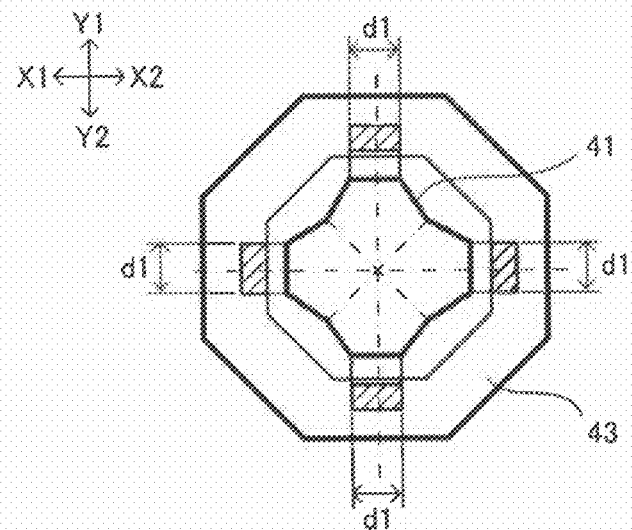
FIG. 21A is a plane view showing a more practical shape of a conductor post according to an embodiment of the present invention.
Figure 21B:
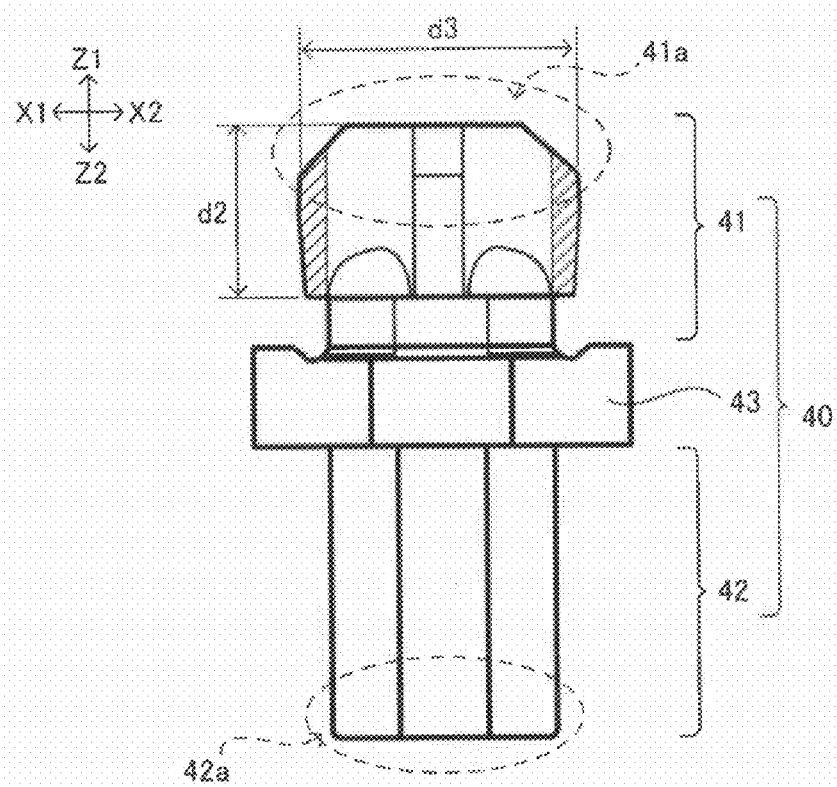
FIG. 21B is a side view showing a more practical shape of a conductor post according to an embodiment of the present invention.
Figure 22A:
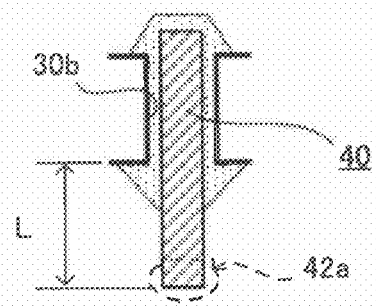
FIG. 22A is an illustration showing the length for determining the aspect ratio of a conductor post in the case of a straight conductor post according to an embodiment of the present invention.
Figure 22B:
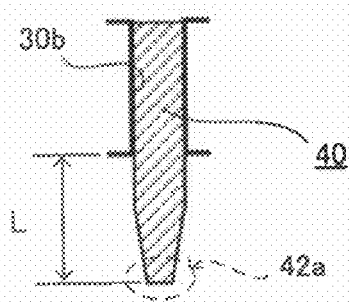
FIG. 22B is an illustration showing the length for determining the aspect ratio of a conductor post in the case of a tapered conductor post according to an embodiment of the present invention.
Figure 22C:
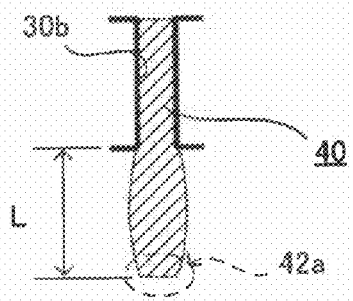
FIG. 22C is an illustration showing the length for determining the aspect ratio of a conductor post in the case of a barrel-shaped conductor post according to an embodiment of the present invention.
Figure 22D:
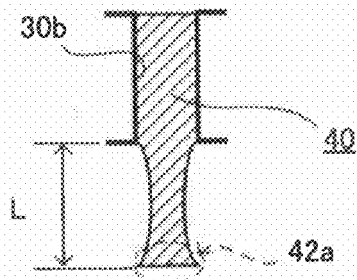
FIG. 22D is an illustration showing the length for determining the aspect ratio of a conductor post in the case of a drum-shaped conductor post according to an embodiment of the present invention.
Figure 23A:
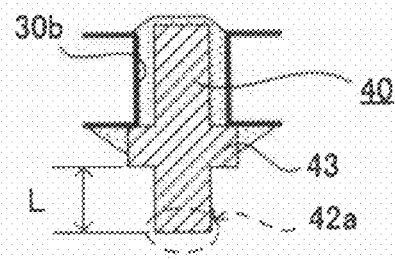
FIG. 23A is an illustration showing the length for determining the aspect ratio of a conductor post in the case of a stepped straight conductor post according to an embodiment of the present invention.
Figure 23B:
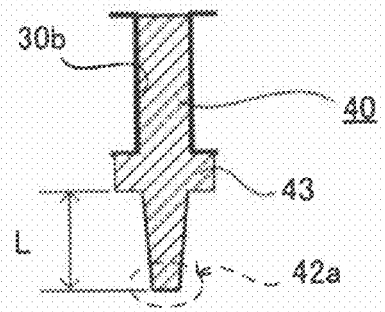
FIG. 23B is an illustration showing the length for determining the aspect ratio of a conductor post in the case of a stepped tapered conductor post according to an embodiment of the present invention.
Figure 23C:
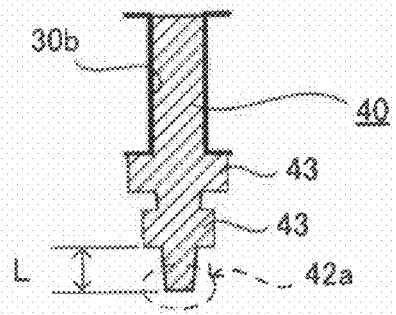
FIG. 23C is an illustration showing the length for determining the aspect ratio of a conductor post in the case of a conductor post having multiple flanges according to an embodiment of the present invention.

The shape of the conductor posts 40 is schematically shown in FIG. 3 and other figures. In practice, it is preferable that the shape of the conductor posts 40 is precisely designed according to applications as shown in FIG. 21A (plane view) and FIG. 21B (side view). For example, it is preferable to eliminate unnecessary parts and make holes so as to reduce the volume as much as possible for reducing the weight or saving the material. The shape shown in FIGS. 21A and 21B will be described in detail in Embodiment 2 given later.

As described above, the width (diameter) of the conductor posts 40 is preferably approximately 2 mm or smaller and particularly preferably approximately 1 mm or smaller. Here, the "width" of tapered, barrel-shaped, or drum-shaped conductor posts of which the cross-sectional area gradually changes (for example, see FIGS. 16B to 16D) can be obtained from the average area along the axial direction. When the average area abruptly changes as of the conductor posts 40 having the flange 43 (the stepped conductor posts 40) (here, the term "abruptly" refers to an average diameter changing more than 0.01 mm per axial length of 0.01 mm), the "width" is obtained from the average area of the part having a little change in area.

As described above, the aspect ratio (length/width) of the conductor posts 40 is preferably approximately 1.1 to approximately 5 and more preferably approximately 1.25 to approximately 3. Here, the "length (L)" is the length of the part up to the second end 42a that is not inserted in the hole 30b as shown in FIGS. 22A to 22D by way of example. When the conductor posts 40 have a flange 43, the length of the part between the flange 43 and second end 42a corresponds to the "length (L)."

The structure of the semiconductor devices 101 and 102 and the type, performance, dimension, material, shape, number of layers, or arrangement of their components can be modified on an arbitrary basis without departing from the scope of the present invention.

The production method of the present invention is not confined to the contents and sequence shown in the flowchart of FIG. 5. The contents and sequence can be modified on an arbitrary basis without departing from the scope of the present invention. Furthermore, unnecessary steps can be eliminated depending on applications.

Embodiment 1

A semiconductor device 102 according to Embodiment 1 (see FIGS. 7 and 8) will be described hereafter. In this embodiment, the same elements as those shown in the above embodiment will be referred to by the same reference numbers and further detailed parameters are presented for each element.

The semiconductor element 10 is an Si IGBT chip of 0.09 mm in thickness and 8×8 mm in size. The semiconductor element 10 has external connection terminals 61 to 64 as external electrodes. The external connection terminal 61 is a collector electrode of 10×1 mm in size and 40 mm in length. The external connection terminal 62 is a gate electrode of 1 mm in diameter and 29 mm in length. The external connection terminal 63 is an electrode for various sensors of 1 mm in diameter and 29 mm in length. The external connection terminal 64 is an emitter electrode of 10×1 mm in size and 29 mm in length.

The semiconductor element 10a is an Si FWD chip of 0.09 mm in thickness and 2×2 mm in size. The electrodes 11a and 12a are the electrodes of the FWD chip.

The heat discharging plate 20 is an ALN heat discharging plate. More specifically, the heat discharging plate 20 consists of an AlN (aluminum nitride) ceramic of 0.64 mm in thickness and 14×12 mm in size. The electrode 21 bonded to one side of the heat discharging plate 20 consists of a copper plate (C1940) of 0.3 mm in thickness and 12×10 mm in size containing "0.85% of Fe, 0.12% of Zn, and 0.03% of P."

The connection board 50 has a support plate 30 and conductor posts 40. The support plate 30 is a wiring board of 0.47 mm in thickness and 14×12 mm in size. The conductor posts 40 have a shape different from the one shown in FIGS. 7 and 8 (see FIG. 26).

The support plate 30 is produced in the following process. This process corresponds to Steps S11 and S12 in FIG. 5.

Figure 24A:
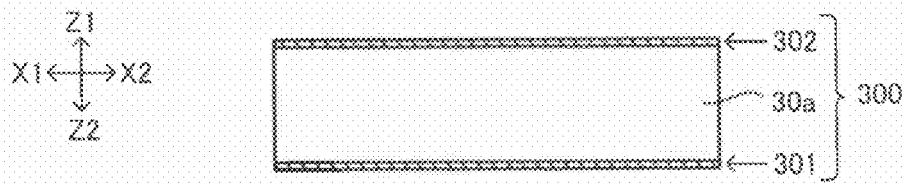
FIG. 24A is an illustration for explaining the first step of the method of producing the support plate according to Embodiment 1.

First, as shown in FIG. 24A, a starting material for the support plate 30 (the starting substrate 300 hereafter) is prepared. The starting substrate 300 consists of HL830NS (ex. Mitsubishi Gas Chemical). HL830NS is a BT resin substrate. The starting substrate 300 is composed of an insulating substrate 30a and copper foils 301 and 302 laminated on either side of the insulating substrate 30a. The insulating substrate 30a has a thickness of 0.2 mm and the copper foils 302 and 302 have a thickness of 0.105 mm.

Figure 24B:
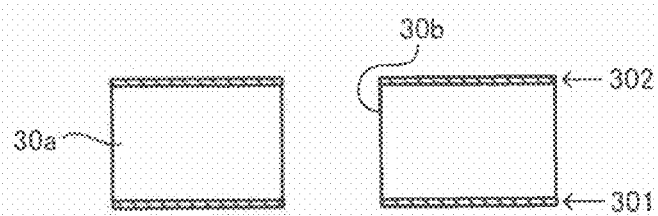
FIG. 24B is an illustration for explaining the second step following the step in FIG. 24A.

Subsequently, as shown in FIG. 24B, a hole 30b of 0.5 mm in diameter is formed in the starting substrate 300 by drilling. The hole 30b is a through-hole. The hole 30b is so formed as to face the electrodes 12 to 14 and 12a (pad). The number of holes 30b facing each electrode is as follows: 2 for the gate electrode, 1 for the sensor electrode, and 3×5=15 for the emitter electrode with regard to the electrodes 12 to 14 of the semiconductor element 10, and 2×2=4 for the electrode 12a of the semiconductor element 10a. The holes 30b are formed at pitches of 1 mm and placed at the centers of the electrodes 12 to 14 and 12a.

Figure 24C:
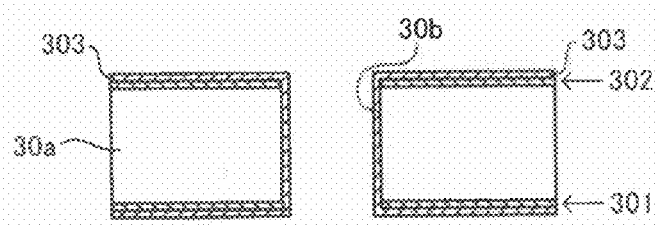
FIG. 24C is an illustration for explaining the third step following the step in FIG. 24B.

Subsequently, as shown in FIG. 24C, a chemical copper-plated film 303 of 0.1 μm in thickness is formed on the entire substrate surface by chemical copper plating (ex. C. Uyemura & Co., Ltd).

Figure 24D:
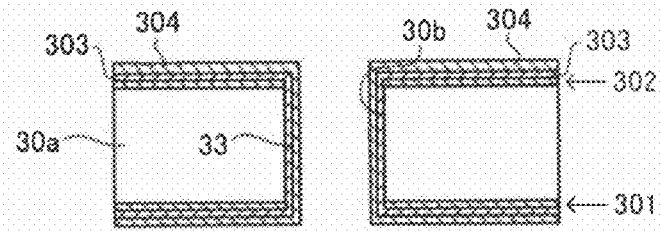
FIG. 24D is an illustration for explaining the fourth step following the step in FIG. 24C.

Subsequently, as shown in FIG. 24D, an electrolytic copper-plated film 304 of 40 μm in thickness is formed on the entire substrate surface by electrolytic copper plating (ex. Okuno Chemical Industries). As a result, a conductor layer consisting of three layers, the copper foil 301 or 302, chemical copper-plated film 303, and electrolytic copper-plated film 304, is formed on either side of the substrate and the conductor 33 (copper plated film) is formed in the hole 30b.

Figure 24E:
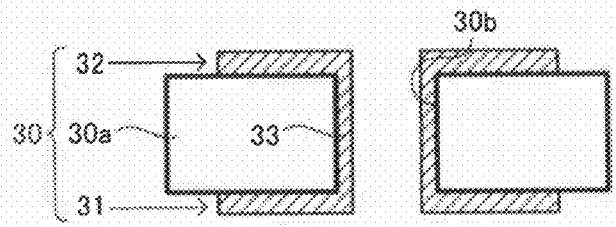
FIG. 24E is an illustration for explaining the fifth step following the step in FIG. 24D.

Subsequently, as shown in FIG. 24E, the conductor layer on either side of the substrate formed as described above is patterned to form conductor circuits 31 and 32. More specifically, a photosensitive dry film is laminated on either side of the plated substrate and patterned by photolithography. As a result, a dry film having a geometry and dimensions corresponding to the electrodes of the semiconductor elements 10 and 10a is formed. Then, the conductor layer is etched by a copper chloride solution with the dry film remaining on the conductor layer. As a result, the conductor circuits 31 and 32 are formed.

Subsequently, the substrate on which the conductor circuits 31 and 32 are formed is cut into a piece of 14×12 mm in size. A dicing saw (ex. Tokyo Seimitsu) is used for cutting. As a result, a support plate 30 of 0.49 mm in thickness is obtained.

The conductor post 40 is inserted in the hole 30b of the support plate 30 as described below. This process corresponds to Step S13 in FIG. 5.

Figure 25A:
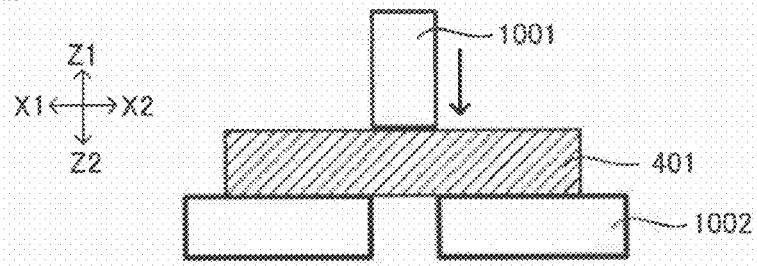
FIG. 25A is an illustration for explaining the first step of the method of inserting a conductor post in a hole of the support plate in Embodiment 1.

First, as shown in FIG. 25A, a copper plate 401 of 0.8 mm in thickness is set in a metal mold (a mold punch 1001 and a mold die 1002). The copper plate 401 is made of oxygen-free copper C1020 (ex. Mitsubishi Shindoh). The mold punch 1001 has a diameter of 0.45 mm.

Figure 25B:
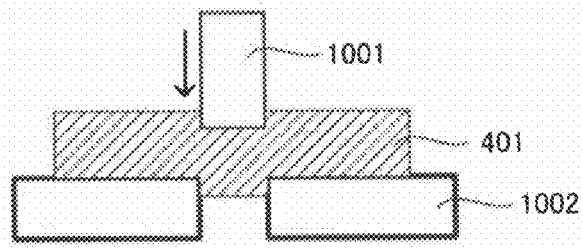
FIG. 25B is an illustration for explaining the second step following the step in FIG. 25A.

Subsequently, as shown in FIG. 25B, the mold punch 1001 is punched in the copper plate 401 so that the copper plate 401 protrudes by 0.05 mm.

Figure 25C:
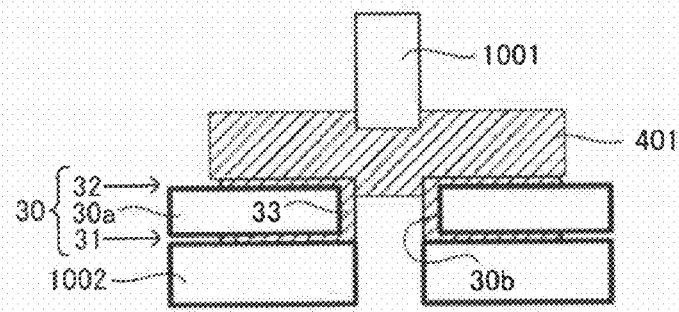
FIG. 25C is an illustration for explaining the third step following the step in FIG. 25B.

Subsequently, as shown in FIG. 25C, the protrusion of the copper plate 401 is placed and pressed against the hole 30b of the support plate 30.

Figure 25D:
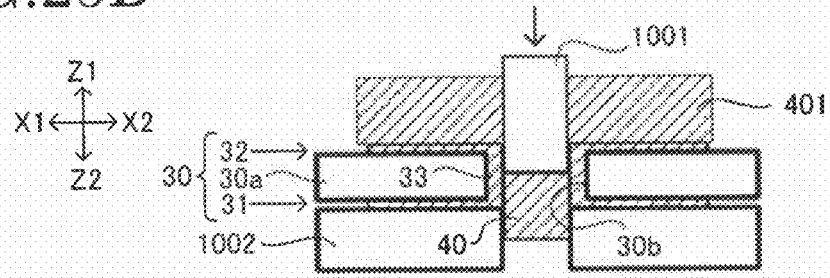
FIG. 25D is an illustration for explaining the fourth step following the step in FIG. 25C.
Figure 25E:
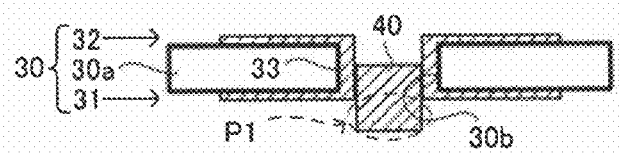
FIG. 25E is an illustration for explaining the fifth step following the step in FIG. 25D.

Subsequently, as shown in FIG. 25D, the copper plate 401 is punched in the hole 30b using the mold punch 1001. As a result, as shown in FIG. 25E, the conductor post 40 passes through the hole 30b and protrudes on the opposite side (in the direction of the arrow Z2) by approximately 0.6 mm. The parameters of the protrusion of the conductor post 40 (the protrusion P1 in the figure) are "an average diameter of 0.44 mm, an average protrusion quantity of 0.595 mm, and an aspect ratio of 1.352." The measured Vickers hardness of the protrusion P1 was 115.

Figure 26:
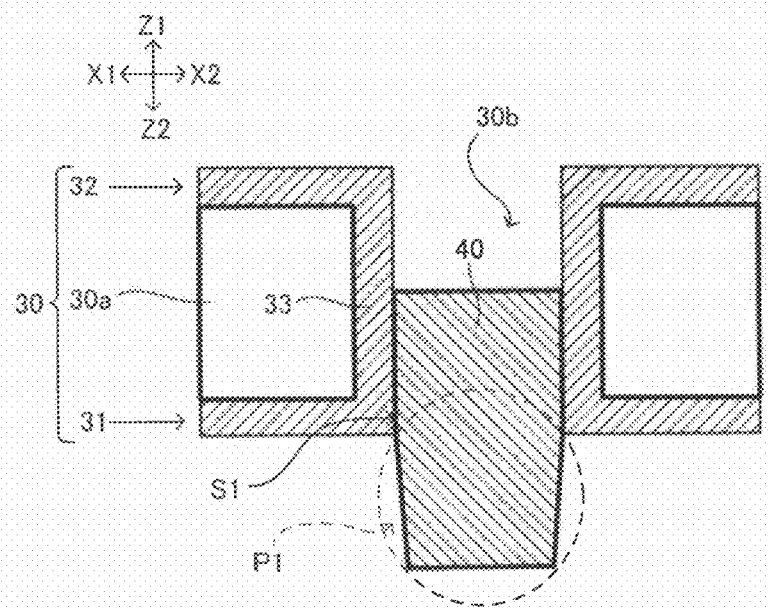
FIG. 26 is an illustration showing the conductor post according to Embodiment 1 being connected to the support plate.

In this embodiment, the conductor post 40 is inserted in the hole 30b of the support plate 30 from the second end 42a. The conductor post 40 is fixed while it is fitted in the conductor 33. Consequently, the fitting area (the area in which the conductor post 40 is fixed to the conductor 33 on the wall of the hole 30b) was 0.276 mm². As shown in FIG. 26, the sidewall S1 (peripheral surface) of the conductor post 40 and the sidewall of the conductor circuit 31 are nearly entirely in contact with each other.

The conductor posts 40 are inserted (fitted) in all holes 30b by the above-described method. Consequently, the coplanarity of the conductor posts 40 was 0.028 mm. Here, the coplanarity is a degree of terminals of parts being arranged in the same plane (uniformity).

Subsequently, Sparkle Flux WF-6400 (ex. Senju Metal Industry) and Ecosolder ball S M705 (ex. Senju Metal Industry) are filled in the gap between the support plate 30 and conductor post 40 in the hole 30b. Ecosolder ball S M705 is a Pb-free solder ball having a diameter of 0.3 mm and containing "3% of Ag and 0.5% of Cu."

Subsequently, the support plate 30 is passed through an $N_2$ atmosphere reflow furnace at a speed of 60 mm/min to solder the wall of the hole 30b and the conductor post 40. As a result, the connection between the support plate 30 and conductor post 40 is reinforced. Consequently, the connection board 50 is produced. The highest reaching temperature by heating to melt solder is 280° C. The board is heated to approximately 240° C. and above for 35 minutes. Then, after cooled down to the normal temperature, the soldered board is removed from the reflow furnace at a cooling rate of 5° C./min. The measured Vickers hardness of the protrusion P1 was 63.

The semiconductors 10 and 10a are mounted on (connected to) the heat discharging plate 20 as described below. This process corresponds to Step S14 in FIG. 5.

The electrode 11 of the semiconductor element 10 and the electrode 11a of the semiconductor element 10a are connected to the electrode 21 of the heat discharging plate 20 by the conductive materials 71a and 71c. The conductive materials 71a and 71c consist of Sn solder containing "3% of Ag and 0.5% of Cu." The semiconductor elements 10 and 10a are soldered by the conductive materials 71a and 71c in an $N_2$ atmosphere reflow furnace. The highest reaching temperature by heating to melt solder is 260° C. The board is heated to approximately 240° C. and above for 90 seconds.

The semiconductor elements 10 and 10a are mounted on (connected to) the connection board 50 as described below. This process corresponds to Step S15 in FIG. 5.

After the semiconductor elements 10 and 10a are mounted on the heat discharging plate 20, the conductive materials 72a to 72d of 30 μm in thickness are printed on the electrodes 12 to 14 of the semiconductor element 10 and the electrode 12a of the semiconductor element 10a. The conductive materials 72a to 72d consist of, for example, a solder paste S70G (ex. Senju Metal Industry). The solder paste S70G is a Sn solder containing "3% of Ag and 0.5% of Cu."

Subsequently, the conductor posts 40 are placed against the electrodes of the semiconductor elements 10 and 10a.

Then, the support plate 30 is passed through a $H_2$ reflow furnace (ex. Denko) at a speed of 120 mm/min to solder the electrodes of the semiconductor elements 10 and 10a and the conductor posts 40. The highest reaching temperature by heating to melt solder is 350° C. The board is heated to approximately 270° C. and above for 25 minutes. Then, the soldered board is removed from the reflow furnace at a cooling rate of 100° C./min.

With the above method, solder fillets are formed in the conductive materials 72a to 72d for connecting the conductor posts 40. The solder (the conductive materials 72a to 72d) is raised to a height of 0.2 mm. The measured Vickers hardness of the sidewall of the conductor posts 40 was 42, which is a low level of hardness.

The electrodes of the semiconductor elements 10 and 10a and the conductor posts 40 are collectively connected (collective connection) by the above method. Then, the external connection terminals 61 to 65 are connected by soldering pursuant to the above method to complete the semiconductor device 102.

The semiconductor device 102 according to Embodiment 1 obtained as described above is highly reliable against long-term heat cycles. In this regard, the inventor conducted a power cycle endurance test.

More specifically, in one cycle, the semiconductor element 10 was rapidly heated from a normal temperature of 25° C. to 150° C. within one second while a current ran through the semiconductor element 10; the current was cut off when the temperature reached 150° C.; and the semiconductor element 10 was forcefully cooled down to the normal temperature within five seconds. The above cycle was repeated until the semiconductor device 102 broke down.

The above test revealed that 15 conductor posts 40 belonging to the emitter post E reach 150° C. after 60 A (ampere) per conductor post, namely a total of 900 A is applied in the semiconductor device 102 of Embodiment 1. Furthermore, the semiconductor device 102 operated with no disconnection after 30 continuous days of the test (430000 cycles) (in other words, it did not break down); then, the test was terminated. After the termination of the test, the measured Vickers hardness of the conductor posts 40 was 68, revealing that the conductor posts 40 were hardened during the test.

The same test was conducted on another semiconductor device for comparison.

The semiconductor device of Comparative Embodiment 1 was a semiconductor device in which pure aluminum wires of 0.4 mm in diameter and 15 mm in length were connected to the electrodes (external output terminals) of an IGBT chip by aluminum wire wedge bonding. The semiconductor device of Comparative Embodiment 1 reached 150° C. with a current of 13 A in the above test. This revealed that only a lower current could run through the IGBT chip. Furthermore, disconnection occurred in aluminum wire connection parts after 1225 cycles.

Embodiment 2

A semiconductor device 101 according to Embodiment 2 (see FIGS. 1 and 2) will be described hereafter. In this embodiment, the same elements as those shown in the above embodiment will be referred to by the same reference numbers and further detailed parameters are presented for each element.

As in Embodiment 1, the semiconductor element 10 is an IGBT chip and the heat discharging plate 20 is an ALN heat discharging plate. The support plate 30 is also produced as in Embodiment 1. However, the holes 30b are through-holes having a diameter of 0.42 mm.

The conductor posts 40 are produced as described below.

First, a 99.9% pure aluminum wire (1N99) having a diameter of 0.5 mm is prepared. Then, the aluminum wire is processed by drawing using a mold to obtain the shape shown in FIGS. 21A and 21B. Consequently, the aluminum conductor posts 40 are completed. The end face (an X-Y plane) of the conductor posts 40 is in the shape of a regular octagon of 0.145 mm on a side. This is equivalent to a diameter of 0.3595 mm. The horizontal cross section of the flange 43 is in the shape of a regular octagon of 0.29 mm on a side. The flange 43 has a thickness of 0.2 mm. The conductor posts 40 have a cross-shaped part (the cross part hereafter) at the first end 41a. The cross part consists of four small segments. Each small segment has a width (d1 in FIG. 21A) of 0.1 mm. The cross part has a height (d2 in FIG. 21B) of 0.4 mm and a width (d3 in FIG. 21B) of 0.46 mm. In other words, the cross part is larger than the diameter of the holes 30b. The first column part 41 has a length of 0.4 mm and the second column part 42 has a length of 0.6 mm. The aspect ratio is 2.78. The measured Vickers hardness of the conductor posts 40 immediately after they were molded was 93.

Figure 27:
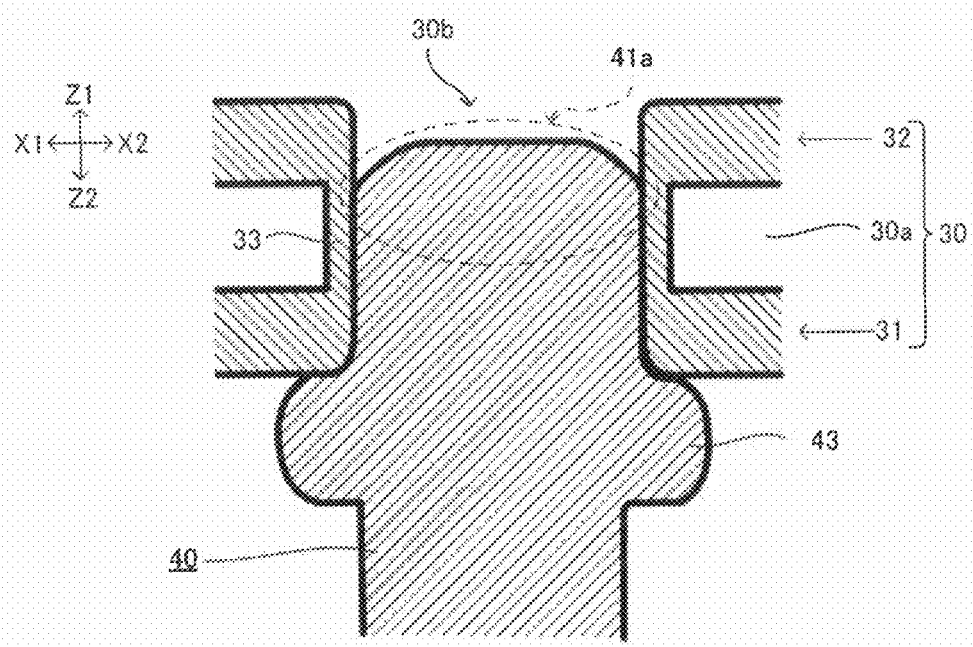
FIG. 27 is an illustration showing the conductor post according to Embodiment 2 being connected to the support plate.

Subsequently, the cross part of the conductor post 40 is pressed into the hole 30b of the support plate 30 under a pressure of 17 N. As a result, as shown in FIG. 27, the conductor post 40 is inserted (fitted) in the hole 30b of the support plate 30 from the first end 41a. Consequently, the fitting area was 0.144 mm$^2$.

The conductor posts 40 are inserted (fitted) in all holes 30b by the above method. Consequently, the coplanarity of the conductor posts 40 was 0.012 mm.

Subsequently, solder balls are fed as in Embodiment 1 to fix the conductor posts 40 in a reflow furnace. The measured Vickers hardness of the conductor posts 40 was 25.

Then, the semiconductor element 10 is connected to the heat discharging plate 20 and connection board 50 in sequence and the external connection terminals 61 to 64 are connected by soldering to complete the semiconductor device 101. In the semiconductor device 101, the solder (conductive materials 72a to 72c) was raised to a height of 0.3 mm and solder fillets are formed. The measured Vickers hardness of the sidewall of the conductor posts 40 was 24.

The same power cycle endurance test as in Embodiment 1 was conducted on the semiconductor device 101 according to Embodiment 2 obtained as described above. The semiconductor device 101 reached 150° C. by applying 23 A (ampere) per conductor post, namely a total of 345 A to 15 conductor posts 40 belonging to the emitter post E. Furthermore, disconnection occurred after 285456 cycles. In examination of the disconnection site, cracks were observed from the sides of the solder fillets to inside the solder (conductive materials 72a to 72c) connecting to the conductor posts 40. However, the semiconductor device 101 of Embodiment 2 was found to be approximately 200 times or more durable than the above-described Comparative Embodiment 1. The measured Vickers hardness of the conductor posts 40 after the test was 72, revealing that the conductor posts 40 were hardened during the test.

Other Embodiments

The Vickers hardness and durability were measured in some embodiments in which conditions such as materials are changed from Embodiment 2, namely embodiments in which the heat conductivity and Vickers hardness are changed (Embodiments 3 and 4 and Comparative Embodiments 2 and 3) and embodiments in which the diameter and aspect ratio of conductor posts 40 are changed (Embodiments 5 to 8). The results are shown in FIGS. 28 to 32 along with the results in the above-described Embodiments 1 and 2 and Comparative Embodiment 1. In the figures, the samples #11 to #18 correspond to the semiconductor devices in Embodiments 1 to 8, and the samples #21 to #23 correspond to the semiconductor devices in Comparative Embodiments 1 to 3. FIG. 28 shows the material and so on of the support plate 30. FIG. 29 shows the material and so on of the conductor posts 40. FIG. 30 shows the soldering conditions. FIG. 31 shows the measurements of Vickers hardness. FIG. 32 shows the power cycle endurance test results. Here, neither one of the samples #21 to #23 (Comparative Embodiments 1 to 3) satisfied the requirements of heat conductivity of approximately 200 W/m·K or higher and Vickers hardness (after the chip is joined) of approximately 70 or lower.

As shown in FIG. 32, the samples #11 to #18 (Embodiments 1 to 8) allow a larger amount of current to run compared with the samples #21 to #23 (Comparative Embodiments 1 to 3) and are highly reliable against long-term heat cycles.

In comparison among the samples #13 and #15 to #18 having similar levels of Vickers hardness (after the chip is joined) and heat conductivity, particularly the sample #15 having an aspect ratio of approximately 1.25 to approximately 3 allows a large amount of current to run and is highly reliable against long-term heat cycles.

In comparison between the samples #13 and #14 having similar levels of Vickers hardness (after the chip is joined) and aspect ratios, the sample #13 having higher heat conductivity (approximately 400 W/m·K) allows a large amount of current to run and is highly reliable against long-term heat cycles.

The above-described embodiments and other embodiments can be combined.

Embodiments of the present invention are described above. It should be understood that various modifications and combinations necessary for convenience of designing or other factors fall under the invention described in "Claims" and the scope of the present invention corresponding to the embodiments described in "Mode for Implementing the Present Invention."

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

What is claimed is:

1. A semiconductor device comprising:
   a support plate;
   a semiconductor element; and
   conductor posts consisting of a conductor having a first end at one end and a second end at the other end, said second end being connected to said semiconductor element and said conductor posts being connected to said support plate at a position on the side of said second end that is closer to said first end,
   wherein said conductor posts have a heat conductivity of approximately 200 W/m·K or higher and a Vickers hardness of approximately 70 or lower.
2. The semiconductor device according to claim 1 wherein:
   holes are formed in said support plate; and said conductor posts are fixed with at least a part thereof being inserted in said holes.

3. The semiconductor device according to claim 1 wherein:
said semiconductor device further comprises a heat discharging plate having a conductor layer at least on the main surface closer to said support plate; and
an electrode of said semiconductor element is electrically connected to said conductor layer.

4. The semiconductor device according to claim 1 wherein:
the main constituent of said conductor posts is copper, silver, gold, or aluminum.

5. The semiconductor device according to claim 1 wherein:
said conductor posts are made of oxygen-free copper.

6. The semiconductor device according to claim 1 wherein:
said conductor posts have a Vickers hardness of approximately 65 or lower.

7. The semiconductor device according to claim 1 wherein:
the ratio of the length of the part up to said second end of said conductor posts that protrudes from said support plate to the width of said conductor posts (the length/width) is approximately 1.1 to approximately 5.

8. The semiconductor device according to claim 1 wherein:
the ratio of the length of the part up to said second end of said conductor posts that protrudes from said support plate to the width of said conductor posts (the length/width) is approximately 1.25 to approximately 3.

9. The semiconductor device according to claim 1 wherein:
said conductor posts have a width of approximately 2 mm or smaller.

10. A semiconductor device production method including:
connecting conductor posts to a support plate; and
connecting said conductor posts to a semiconductor element,
wherein said conductor posts have a Vickers hardness of approximately 100 or higher at least either when said conductor posts are connected to said support plate or when said conductor posts are connected to said semiconductor element and, then, the Vickers hardness of said conductor posts is adjusted to approximately 70 or lower.

11. The semiconductor device production method according to claim 10 wherein:
said method further includes forming holes in said support plate; and
said conductor posts are at least partly inserted in said holes when said conductor posts are connected to said support plate.

* * * * *